(12) United States Patent
Koyama

(10) Patent No.: US 9,390,665 B2
(45) Date of Patent: Jul. 12, 2016

(54) DISPLAY DEVICE

(71) Applicant: SEMICONDUCTOR ENERGY LABORATORY CO., LTD., Atsugi-shi, Kanagawa-ken (JP)

(72) Inventor: Jun Koyama, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 110 days.

(21) Appl. No.: 14/085,952

(22) Filed: Nov. 21, 2013

(65) Prior Publication Data

US 2014/0152630 A1 Jun. 5, 2014

(30) Foreign Application Priority Data

Nov. 30, 2012 (JP) ................................ 2012-262851

(51) Int. Cl.
| | |
|---|---|
| G09G 3/36 | (2006.01) |
| G06F 3/041 | (2006.01) |
| H01L 29/786 | (2006.01) |
| G02F 1/1333 | (2006.01) |
| G02F 1/1368 | (2006.01) |
| G02F 1/136 | (2006.01) |

(52) U.S. Cl.
CPC ............ *G09G 3/3614* (2013.01); *G06F 3/0412* (2013.01); *G09G 3/3648* (2013.01); *H01L 29/7869* (2013.01); *H01L 29/78696* (2013.01); *G02F 1/1368* (2013.01); *G02F 1/13338* (2013.01); *G02F 2001/13606* (2013.01); *G09G 2320/0219* (2013.01); *G09G 2320/0247* (2013.01); *G09G 2320/103* (2013.01); *G09G 2330/021* (2013.01)

(58) Field of Classification Search
None
See application file for complete search history.

(56) References Cited

U.S. PATENT DOCUMENTS

| | | | |
|---|---|---|---|
| 5,526,012 A | * | 6/1996 | Shibahara ..................... 345/92 |
| 5,583,532 A | | 12/1996 | Watanabe |
| 5,731,856 A | | 3/1998 | Kim et al. |
| 5,744,864 A | | 4/1998 | Cillessen et al. |
| 6,028,650 A | | 2/2000 | Kuroha et al. |
| 6,211,866 B1 | | 4/2001 | Okutani |
| 6,294,274 B1 | | 9/2001 | Kawazoe et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Antonio Xavier
(74) *Attorney, Agent, or Firm* — Nixon Peabody LLP; Jeffrey L. Costellia

(57) ABSTRACT

A novel highly reliable display device is provided. Further, a novel display device capable of displaying images with less flicker is provided. Further, a display device capable of displaying eye-friendly still images is provided. The display device includes a feedthrough correction circuit which corrects a primary image signal. The feedthrough correction circuit corrects the primary image signal to compensate predicted feedthrough.

18 Claims, 19 Drawing Sheets

(56) References Cited

U.S. PATENT DOCUMENTS

| | | | |
|---|---|---|---|
| 6,563,174 B2 | 5/2003 | Kawasaki et al. | |
| 6,727,522 B1 | 4/2004 | Kawasaki et al. | |
| 6,862,014 B2 | 3/2005 | Ohtani et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 8,432,502 B2 | 4/2013 | Yamazaki et al. | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2004/0246214 A1* | 12/2004 | Yu | G09G 3/3688 345/87 |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0092109 A1* | 5/2006 | Hsu et al. | 345/87 |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0187160 A1* | 8/2006 | Lai | G09G 3/3611 345/88 |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0278431 A1* | 11/2008 | Feng | 345/99 |
| 2008/0284680 A1* | 11/2008 | Chen | G09G 3/3648 345/55 |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0115772 A1* | 5/2009 | Shiomi et al. | 345/214 |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0014012 A1* | 1/2010 | Irie et al. | 349/39 |
| 2010/0065844 A1 | 3/2010 | Tokunaga | |
| 2010/0066656 A1* | 3/2010 | Yang | G09G 3/3659 345/92 |
| 2010/0092800 A1 | 4/2010 | Itagaki et al. | |
| 2010/0109002 A1 | 5/2010 | Itagaki et al. | |
| 2011/0090183 A1 | 4/2011 | Yamazaki et al. | |
| 2011/0090204 A1 | 4/2011 | Yamazaki et al. | |
| 2011/0090207 A1 | 4/2011 | Yamazaki et al. | |
| 2011/0102696 A1 | 5/2011 | Yamazaki et al. | |
| 2011/0109351 A1* | 5/2011 | Yamazaki | H01L 27/1225 327/109 |
| 2011/0115839 A1 | 5/2011 | Takahashi et al. | |
| 2011/0148846 A1 | 6/2011 | Arasawa et al. | |
| 2011/0199404 A1* | 8/2011 | Umezaki et al. | 345/691 |
| 2011/0215323 A1* | 9/2011 | Kurokawa | H01L 27/14616 257/53 |
| 2011/0269266 A1* | 11/2011 | Yamazaki | H01L 21/02554 438/104 |
| 2012/0062813 A1* | 3/2012 | Koyama | 349/43 |
| 2012/0319102 A1* | 12/2012 | Yamazaki | H01L 29/7869 257/43 |
| 2013/0120335 A1* | 5/2013 | Hou | G09G 3/3648 345/211 |
| 2013/0271682 A1* | 10/2013 | Liou et al. | 349/41 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-114659 | 4/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| | | |
|---|---|---|
| JP | 2011-186449 | 9/2011 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.
Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the $In_2O_3$—$Ga_2ZnO_4$—ZnO system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.
Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MOO_3$ as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering.", SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel Using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

(56) References Cited

OTHER PUBLICATIONS

Godo.H et al., "P-9:Numerical Analysis on Temperature Dependence of Characteristics of Amorphous In—Ga—Zn—Oxide TFT,", SID Digest '09 : SID International Symposium Digest of Tehnical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "SPINEL,Y8FE2O4, and YB2FE3O7 Types of Structures for Compounds in the IN2O3 and SC2O3—A2O3—Bo Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m <4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al.. "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

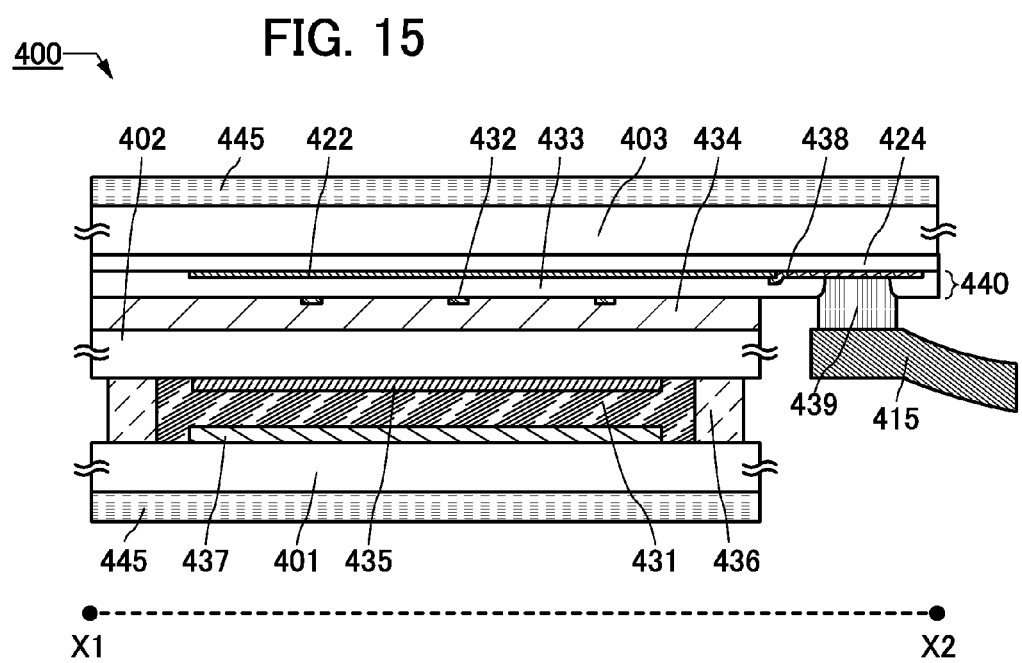

DISPLAY DEVICE

BACKGROUND OF THE INVENTION

1. Field of the Invention

The present invention relates to an object, a method, a manufacturing method, a process, a machine, manufacture, or a composition of matter. In particular, the present invention relates to, for example, a semiconductor device, a display device, a light-emitting device, a driving method thereof, or a manufacturing method thereof. For example, the present invention particularly relates to a display device. Specifically, the present invention relates to a display device including a liquid crystal element, an information processing device, an electronic device, or the like.

2. Description of the Related Art

A technique is known in which a refresh rate is reduced when a still image is displayed on a display portion, so that power consumption is reduced.

REFERENCE

Patent Document

[Patent Document 1] Japanese Published Patent Application No. 2011-186449

SUMMARY OF THE INVENTION

A display device includes a display portion to which signals including image data are input and which displays an image based on the signals. The display portion includes a pixel region in which a plurality of pixels each including a display element are arranged.

An image displayed by the pixels is rewritten (refreshed) at a rate (e.g., 60 Hz) which hardly allows a user of the display device to recognize a change in image. In this manner, a smooth moving image and a still image which appears still can be displayed by the pixels.

In some cases, however, a change that is caused when an image displayed by the pixels is rewritten is recognized as flicker by the user.

One embodiment of the present invention is made in view of the foregoing technical background. An object of one embodiment of the present invention is to provide a novel display device. Another object of one embodiment of the present invention is to provide a display device which is less affected by noise. Another object of one embodiment of the present invention is to provide a display device which is less affected by feedthrough. Another object of one embodiment of the present invention is to provide a display device capable of displaying images with less flicker. Another object of one embodiment of the present invention is to provide a highly reliable display device. Another object of one embodiment of the present invention is to provide a display device capable of displaying clear images. Another object of one embodiment of the present invention is to provide a display device capable of eye-friendly display. Another object of one embodiment of the present invention is to provide a display device capable of display which is less likely to cause eye fatigue. Another object of one embodiment of the present invention is to provide a display device capable of display with low power consumption. Another object of one embodiment of the present invention is to provide a display device in which leakage current is low. Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is an eye-friendly display device including a display portion and a control portion. Display light of the display portion does not include light with a wavelength shorter than 420 nm. The display portion includes a pixel portion that includes a plurality of pixels arranged at a resolution of 150 ppi or more, a plurality of signal lines supplying first driving signals (also referred to as S signals) to the plurality of pixels column by column, and a plurality of scan lines supplying second driving signals (also referred to as G signals) to the plurality of pixels row by row. The control portion outputs a secondary image signal to the display portion.

Each of the pixels includes a transistor including a gate electrode to which the G signal is input and a first electrode to which the S signal is input, and a display element including a first electrode electrically connected to a second electrode of the transistor and a second electrode to which a common potential is supplied.

The control portion includes a feedthrough correction circuit and a polarity determination circuit which determines a polarity of the secondary image signal.

The feedthrough correction circuit is configured to output the secondary image signal that has an amplitude corresponding to a difference between a potential of a primary image signal corrected so that feedthrough caused by the transistor is compensated and a reference potential.

Another embodiment of the present invention is an eye-friendly display device including a display portion and a control portion. Display light of the display portion does not include light with a wavelength shorter than 420 nm. The display portion includes a pixel portion that includes a plurality of pixels arranged at a resolution of 150 ppi or more, a plurality of signal lines supplying first driving signals (also referred to as S signals) to the plurality of pixels column by column, and a plurality of scan lines supplying second driving signals (also referred to as G signals) to the plurality of pixels row by row. The control portion outputs a secondary image signal to the display portion.

Each of the pixels includes a transistor including a gate electrode to which the G signal is input and a first electrode to which the S signal is input, and a display element including a first electrode electrically connected to a second electrode of the transistor and a second electrode to which a common potential is supplied.

The control portion includes a feedthrough correction circuit and a polarity determination circuit which determines a polarity of the secondary image signal.

The feedthrough correction circuit is configured to output the secondary image signal that has an amplitude corresponding to a difference between a potential of a primary image signal corrected so that the amplitude is smaller when the polarity is negative than when the polarity is positive and a reference potential.

Another embodiment of the present invention is an eye-friendly display device including a display portion and a control portion. Display light of the display portion does not include light with a wavelength shorter than 420 nm. The display portion includes a pixel portion that includes a plurality of pixels arranged at a resolution of 150 ppi or more, a plurality of signal lines supplying S signals to the plurality of pixels column by column, a plurality of scan lines supplying G signals to the plurality of pixels row by row, and a G driver circuit that can supply the G signals. The control portion outputs a secondary image signal to the display portion and outputs a scan start signal to the G driver circuit.

Each of the pixels includes a transistor including a gate electrode to which the G signal is input and a first electrode to which the S signal is input, and a display element including a first electrode electrically connected to a second electrode of the transistor and a second electrode to which a common potential is supplied.

The control portion includes a feedthrough correction circuit and a polarity determination circuit which determines a polarity of the secondary image signal.

The feedthrough correction circuit is configured to output the secondary image signal that has an amplitude corresponding to a difference between a potential of a primary image signal corrected so that the amplitude is smaller when the polarity is negative than when the polarity is positive and a reference signal.

Another embodiment of the present invention is the above eye-friendly display device in which the feedthrough correction circuit is configured to generate the secondary image signal by adding feedthrough $\Delta V_1$ calculated from a formula (1) to the potential of the primary image signal when the polarity of the secondary image signal determined by the polarity determination circuit is positive and by adding feedthrough $\Delta V_2$ calculated from a formula (2) to the potential of the primary image signal when the polarity of the secondary image signal determined by the polarity determination circuit is negative.

$$\Delta V_1 = f_{(VgH-Vsc-VS1-Vth)} \quad (1)$$

$$\Delta V_2 = f_{(VgH-Vsc+VS2-Vth)} \quad (2)$$

Note that in the formula (1) and the formula (2), VgH represents a high potential of the G signal, Vsc represents the reference potential for the primary image signal, and Vth represents a threshold voltage of the transistor.

In the display device of one embodiment of the present invention, the amount of feedthrough can be estimated and a secondary image signal which is generated from the primary image signal corrected in advance can be supplied. Thus, a display element can be put in a predetermined display state by a voltage after generation of the feedthrough. Consequently, a novel highly reliable display device can be provided.

Further, a novel display device capable of displaying images with less flicker can be provided. Further, a display device capable of displaying eye-friendly still images can be provided.

Another embodiment of the present invention is the above eye-friendly display device in which the display element is a liquid crystal element.

In the display device of one embodiment of the present invention, a pixel circuit includes the liquid crystal element. The liquid crystal element can be driven with AC voltage and thus can be prevented from deteriorating. Consequently, a novel highly reliable display device can be provided. Further, a novel display device capable of displaying images with less flicker can be provided. Further, a display device capable of displaying eye-friendly still images can be provided.

Another embodiment of the present invention is the above eye-friendly display device in which the transistor includes an oxide semiconductor layer.

In the display device of one embodiment of the present invention, a pixel circuit includes the transistor including an oxide semiconductor layer. Thus, leakage current can be significantly reduced. Moreover, the refresh rate can be made extremely low, and a change in image by refresh operation is hardly recognized. Consequently, a novel highly reliable display device can be provided. Further, a novel display device capable of displaying images with less flicker can be provided. Further, a display device capable of displaying eye-friendly still images can be provided.

Note that in this specification, the display device includes any of the following modules in its category: a module in which a connector such as a flexible printed circuit (FPC) or a tape carrier package (TCP) is attached to a display panel; a module having a TCP provided with a printed wiring board at the end thereof; and a module having an integrated circuit (IC) directly mounted by a chip on glass (COG) method over a substrate over which a display element is formed.

Further, in this specification, one of a first electrode and a second electrode of a transistor refers to a source electrode and the other refers to a drain electrode.

According to one embodiment of the present invention, a novel display device can be provided.

BRIEF DESCRIPTION OF THE DRAWINGS

FIG. 15 is a cross-sectional view of a touch panel of an embodiment.

DETAILED DESCRIPTION OF THE INVENTION

<Example of Problem Solvable by One Embodiment of the Present Invention>

A problem which can be solved by one embodiment of the present invention is described with reference to FIGS. 18A to 18C and FIGS. 19A to 19D. Specifically, the problem is that when driving a liquid crystal element with AC voltage in order to prevent deterioration of the liquid crystal element, flicker is caused by feedthrough, so that a user of a display device feels eye fatigue.

<<Structure of Display Portion and Pixel>>

Figure 18A:
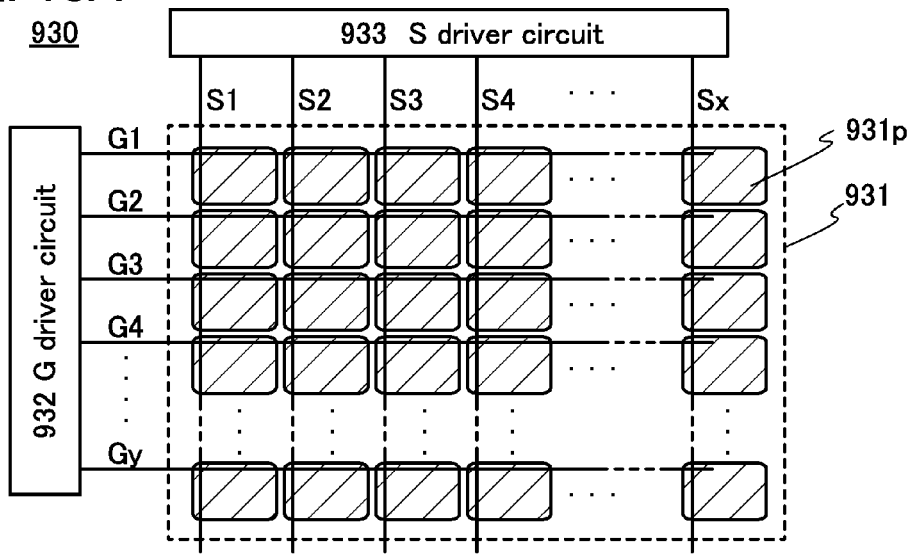
FIG. 18A is a block diagram of a display portion.
Figure 18B:
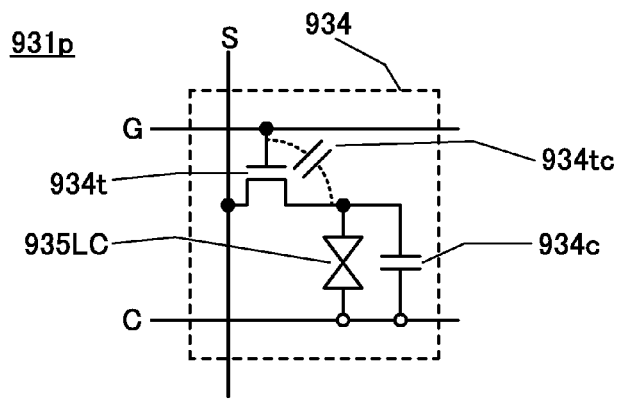
FIG. 18B is an equivalent circuit diagram of a pixel circuit included in a pixel of the display portion.
Figure 18C:
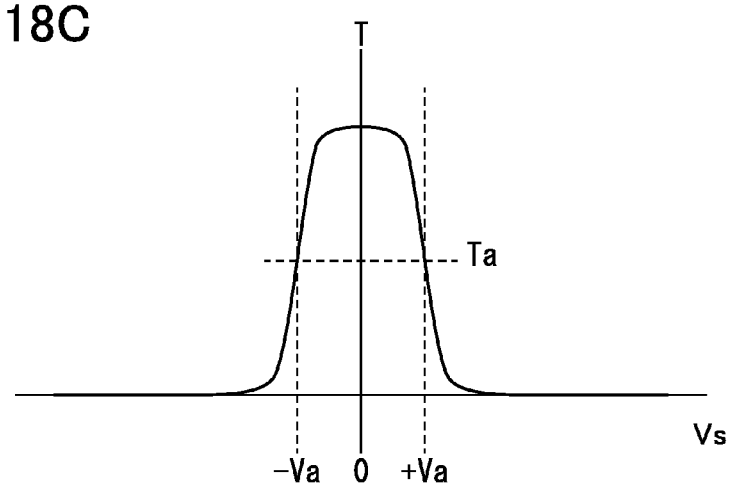
FIG. 18C is a schematic view of polarized light transmittance versus voltage characteristics of a liquid crystal element.

FIG. 18A is a block diagram of a display portion in a display device, FIG. 18B is an equivalent circuit diagram of a pixel circuit included in a pixel of the display portion, and FIG. 18C is a schematic view of polarized light transmittance versus voltage characteristics of a liquid crystal element.

FIGS. 19A to 19D are timing charts and a schematic view showing operations of a pixel circuit of a pixel portion in a display device.

<<Display Device>>

A display portion 930 is part of a display device. The display portion 930 includes a pixel portion 931 (see FIG. 18A).

The pixel portion 931 includes a plurality of pixels 931p, a plurality of signal lines S (S1 to Sx) supplying first driving signals (also referred to as S signals) to the pixels 931p column by column, and a plurality of scan lines G (G1 to Gy) supplying second driving signals (also referred to as G signals) to the pixels 931p row by row.

Each of the plurality of pixels 931p is connected to at least one of the scan lines G and at least one of the signal lines S.

Note that signals for selecting the pixels 931p row by row may be used as the G signals, and the S signals including grayscale information on an image and the like may be supplied to the pixels 931p selected in accordance with the G signals.

A G driver circuit 932 can control input of the G signals to the scan lines G. An S driver circuit 933 can control input of the S signals to the signal lines S.

The pixel 931p described here includes a liquid crystal element 935LC and a pixel circuit 934 including the liquid crystal element 935LC (see FIG. 18B).

The pixel circuit 934 includes a transistor 934t which can control supply of the S signal to the liquid crystal element 935LC.

A gate of the transistor 934t is electrically connected to any one of the scan lines G. A first electrode (one of a source and a drain) of the transistor 934t is electrically connected to any one of the signal lines S. A second electrode (the other of the source and the drain) of the transistor 934t is electrically connected to a first electrode of the liquid crystal element 935LC. A second electrode of the liquid crystal element 935LC is electrically connected to a common line C.

Note that the transistor 934t has a parasitic capacitance 934tc. The parasitic capacitance 934tc includes capacitance between the gate electrode and the source or the drain and capacitance between the gate electrode and a channel.

The pixel circuit 934 may further include a capacitor 934c which can hold voltage between the first electrode and the second electrode of the liquid crystal element 935LC.

The G signal is input to the gate electrode of the transistor 934t, and the transistor 934t can control, as a switching element, input of the S signal to the liquid crystal element 935LC.

The liquid crystal element 935LC includes the first electrode, the second electrode, and a liquid crystal layer including a liquid crystal material to which the voltage between the first electrode and the second electrode is applied.

The polarized light transmittance of the liquid crystal element 935LC is dependent on the alignment state of liquid crystal molecules included in the liquid crystal layer. The alignment state in the liquid crystal layer can be controlled by voltage applied between the first electrode and the second electrode of the liquid crystal element 935LC. Accordingly, when a voltage corresponding to the S signal including grayscale information on an image is applied between the first electrode and the second electrode of the liquid crystal element 935LC, the polarized light transmittance of the liquid crystal element 935LC can be controlled to correspond to the grayscale information.

<<Characteristics of Liquid Crystal Element>>

FIG. 18C schematically shows the relation between the polarized light transmittance of a normally-white liquid crystal element and voltage applied to the liquid crystal element. The vertical axis represents the polarized light transmittance, and the horizontal axis represents the potential of a first electrode of the liquid crystal element with respect to a second electrode.

The polarized light transmittance of the normally-white liquid crystal element is high when the voltage between the first electrode and the second electrode is zero, and is decreased as the voltage is increased. A transmissive liquid crystal display device including such a liquid crystal element can display white when the voltage of the S signal is close to zero and can display black when the voltage of the S signal is high.

It is known that a liquid crystal element deteriorates when DC voltage is kept being applied to a liquid crystal layer of the liquid crystal element for a long time. To prevent such deterioration, a liquid crystal element needs to be driven with AC voltage.

To keep the polarized light transmittance of the liquid crystal element at a transmittance Ta, the liquid crystal element is driven while the polarity of the first electrode with respect to the second electrode is switched between positive (potential +Va) and negative (potential −Va). In other words, the liquid crystal element is driven with AC voltage with constant amplitude.

<<Method for Driving Liquid Crystal Element>>

A method for driving the liquid crystal element 935LC of the pixel circuit 934 with AC voltage is described.

Figure 19A:
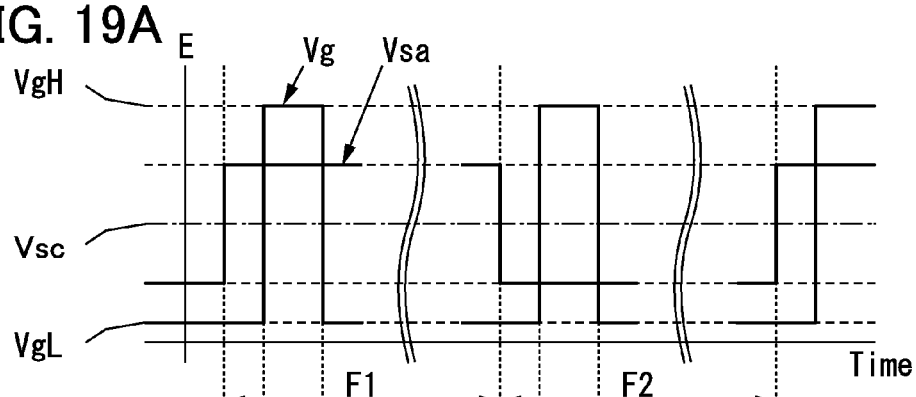
FIGS. 19A to 19D are timing charts and a schematic view showing operations of a pixel circuit of a pixel portion in a display device.
Figure 19B:
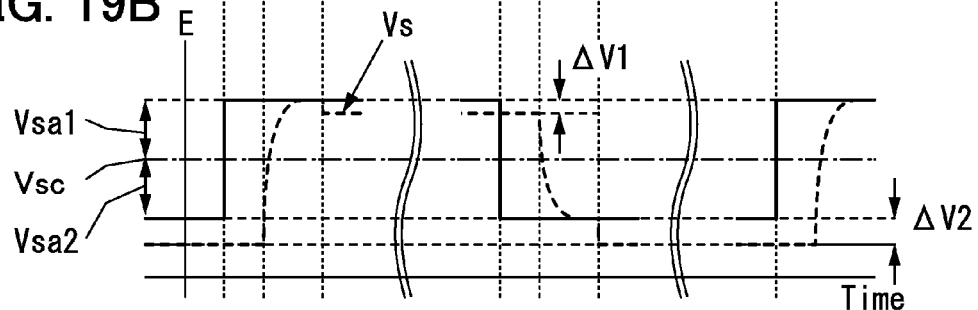
Figure 19C:
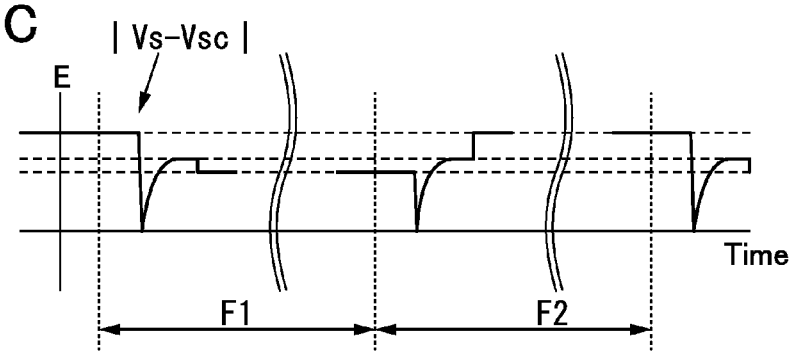

FIG. 19A is a timing chart of a potential Vg of the G signal input to the gate electrode of the transistor 934t of the pixel circuit 934 and a potential Vsa of the S signal input to the first electrode of the transistor 934t. FIG. 19B is a timing chart of a potential Vs output from the second electrode of the transistor 934t. Note that the potential Vs is to be input to the first electrode of the liquid crystal element 935LC.

A secondary image signal is input to the S driver circuit 933, and the S driver circuit 933 outputs the S signal. The S signal may have the same amplitude as the secondary image signal. Note that the secondary image signal is generated from a primary image signal and can have an amplitude corresponding to a difference between the potential of the primary image signal and a reference potential Vsc. The secondary image signal is a signal whose polarity is inverted every frame.

A period between when one scan line G provided in the pixel portion 931 is selected and when the same scan line G is selected again is referred to as one frame. Accordingly, the G signal is input to the gate electrode of the transistor 934t every frame (see FIG. 19A). The potential Vg is VgH when the G signal is high, and is VgL when the G signal is low.

<<Generation of Feedthrough>>

The potential Vs of the second electrode of the transistor 934t is affected by the potential Vg of the gate electrode. Thus, the potential Vs is different from the potential Vsa (which is equal to the potential of the secondary image signal) of the S signal input to the first electrode of the transistor 934t. Described below is an example where there are a period during which the potential of the secondary image signal is higher than the reference potential Vsc by Vsa1 and a period during which the potential of the secondary image signal is lower than the reference potential Vsc by Vsa2. The secondary image signal is input to the S driver circuit, and the S driver circuit generates the S signal having the same potential as the secondary image signal.

In a first frame F1, when a difference between the potential Vg of the gate electrode and the potential Vsa of the S signal exceeds the threshold voltage Vth of the transistor 934t, the transistor 934t is turned on and the potential Vs is raised to the potential Vsa.

Then, when the difference between the potential Vg of the gate electrode and the potential Vsa of the S signal becomes smaller than the threshold voltage Vth, the transistor 934t is turned off and the potential Vs of the second electrode of the transistor 934t is lowered from the potential Vsa of the S signal by ΔV1. The amount by which the potential Vs of the second electrode of the transistor 934t is lowered from the potential Vsa of the S signal is referred to as a first feedthrough ΔV1.

In a second frame F2, the secondary image signal whose polarity has been inverted is input to the S driver circuit 933. When the difference between the potential Vg and the potential Vsa of the S signal exceeds the threshold voltage Vth of the transistor 934t, the transistor 934t is turned on and the potential Vs of the second electrode of the transistor 934t is lowered to the potential Vsa of the S signal.

Then, when the difference between the potential Vg of the gate electrode and the potential Vsa of the S signal becomes smaller than the threshold voltage Vth, the transistor 934t is turned off and the potential Vs of the second electrode of the transistor 934t is lowered from the potential Vsa by ΔV2. The amount by which the potential Vs of the second electrode of the transistor 934t is lowered from the potential Vsa is referred to as a second feedthrough ΔV2.

<<Amount of Feedthrough>>

Feedthrough is caused by capacitive coupling due to the parasitic capacitance 934tc of the transistor 934t (see FIG. 19B). The amount ΔV of the feedthrough can be estimated from a formula (3) below. Note that in the formula, $Vg_{LH}$ represents the amplitude (a difference between VgH and VgL) of the potential of the gate electrode, CL represents the capacitance of the liquid crystal element 935LC, Cs represents the capacitance of the capacitor 934c, and Cdg represents the parasitic capacitance 934tc of the transistor 934t.

$$\Delta V = Vg_{LH} \times \frac{Cdg}{CL + Cs + Cdg} \quad (3)$$

<<Asymmetry of Amount of Feedthrough>>

The G signal input to the gate electrode of the transistor 934t does not have a complete rectangular waveform. For example, in the case where the G signal has a trapezoidal waveform whose upper base is shorter than the lower base, the transistor 934t is in an on state for a longer time when the potential Vs of the input S signal is low than when the potential Vs of the input S signal is high. Therefore, since a value of Cdg is changed by the effect of a channel capacitance or the like, the second feedthrough ΔV2 is larger than the first feedthrough ΔV1, that is, the first feedthrough ΔV1 and the second feedthrough ΔV2 are asymmetric.

Note that even in the case where the first feedthrough ΔV1 and the second feedthrough ΔV2 are asymmetric, the amounts of feedthrough can be estimated on the basis of the potential of the input S signal when the waveform of the G signal is kept constant.

<<Effect of Feedthrough on Polarized Light Transmittance of Liquid Crystal Element>>

When a liquid crystal element is driven with AC voltage with constant amplitude, the polarized light transmittance of the liquid crystal element is kept constant.

However, the polarized light transmittance of the liquid crystal element cannot be kept constant when feedthrough is caused in the pixel circuit.

The action of the first feedthrough ΔV1 reduces |Vs−Vsc|, a difference between the potential Vs of the second electrode of the transistor 934t and the reference potential Vsc. The action of the second feedthrough ΔV2 increases |Vs−Vsc|, a difference between the potential Vs of the second electrode of the transistor 934t and the reference potential Vsc (see FIG. 19C).

Figure 19D:
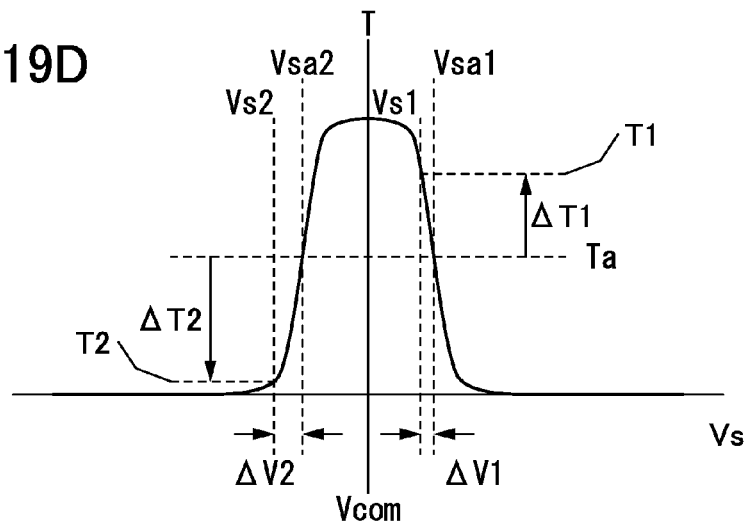

Thus, when the liquid crystal element 935LC is a normally-white liquid crystal element, the polarized light transmittance of the liquid crystal element 935LC is increased from the transmittance Ta by ΔT1 in the first frame F1 and is decreased from the transmittance Ta by ΔT2 in the second frame F2 (see FIG. 19D). The common potential Vcom is a common potential input to the second electrode of the liquid crystal element 935LC and is equal to the reference potential Vsc.

As a result, the polarized light transmittance of the liquid crystal element 935LC in the display portion of the display device is changed (specifically, the amount of change corresponds to the sum of ΔT1 and ΔT2), so that flicker is caused.

<<Eye Fatigue>>

Eye fatigue includes nervous asthenopia.

Nervous asthenopia is caused when a user keeps looking at continuous or blinking light emitted from a display portion for a long time. This is because the brightness stimulates and fatigues the retina or nerve of the eye or the brain. Frequent blinking of fluorescent light or a display portion of a conventional display device, which is called flicker, causes nervous asthenopia.

As described above, there is a problem in that when AC voltage is applied to a liquid crystal element so that the liquid crystal element is driven while being prevented from deteriorating, flicker is caused by feedthrough, so that a user of a display device feels eye fatigue.

<One Embodiment of the Present Invention>

To solve the above problem, one embodiment of the present invention focuses on the relation between an S signal and feedthrough which is caused when a display element is driven with AC voltage.

In the pixel circuit 934, for example, feedthrough is a phenomenon in which when the potential Vg of the G signal is changed from high to low, the potential Vs of the first electrode of the liquid crystal element 935LC is brought close to the low potential of the G signal regardless of the polarity of the S signal. There are a case where the potential Vs of the first electrode of the liquid crystal element 935LC is brought close to the potential of the second electrode by the feedthrough, and a case where the potential Vs is brought far from the potential Vcom of the second electrode of the liquid crystal element 935LC by the feedthrough; the effect on the polarized light transmittance of the liquid crystal element 935LC differs in those cases.

It is difficult for the G signal, which controls the gate electrode of the transistor 934t, to have a complete rectangular waveform; therefore, the feedthrough caused when the polarity of the S signal is positive and the feedthrough caused when the polarity of the S signal is negative are asymmetric. However, the amounts of feedthrough can be estimated when the waveform of the G signal is kept constant and the potential of the input S signal is determined.

Embodiments described below include one embodiment of the present invention which is made with a focus on the amount of feedthrough dependent on the input S signal.

A display device of one embodiment of the present invention includes a feedthrough correction circuit which corrects a primary image signal. The feedthrough correction circuit corrects the primary image signal to compensate predicted feedthrough.

In the display device of one embodiment of the present invention, the amount of feedthrough can be estimated and a secondary image signal which is generated from the primary image signal corrected in advance can be supplied. Thus, the polarized light transmittance of a liquid crystal element can be set to a predetermined level by the potential of the S signal after generation of the feedthrough. Consequently, a novel highly reliable display device can be provided. Further, a novel display device capable of displaying images with less flicker can be provided. Further, a display device capable of displaying eye-friendly still images can be provided.

Embodiments will be described in detail with reference to the drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

(Embodiment 1)

In this embodiment, a structure of a feedthrough correction circuit of one embodiment of the present invention, which corrects an image signal, and a structure of a display device including the feedthrough correction circuit are described with reference to FIGS. 1A, 1B1, and 1B2 and FIGS. 2A and 2B.

Specifically, a feedthrough correction circuit which corrects a primary image signal to compensate predicted feedthrough, a display device including the feedthrough correction circuit, and an information processing device including the display device are described.

Figure 1A:
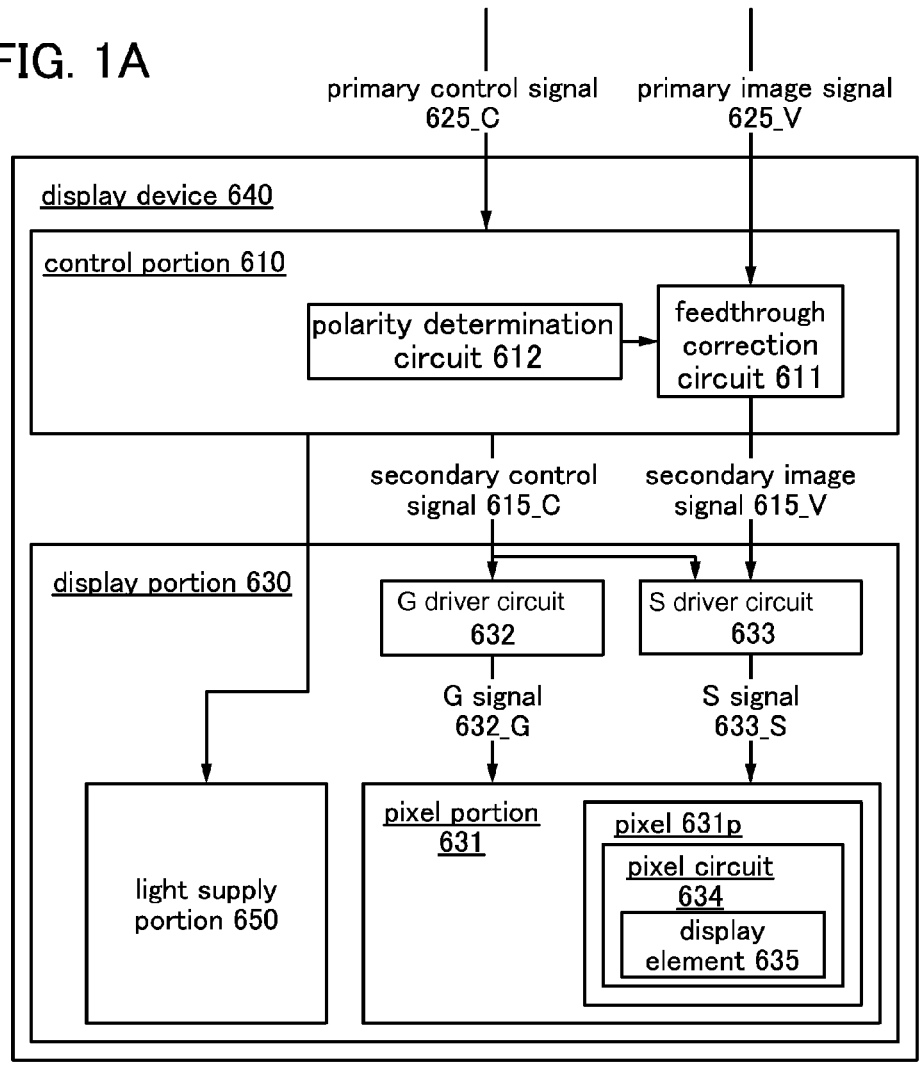
FIG. 1A is a block diagram illustrating a structure of a display device of an embodiment.
Figures 1, 1B:
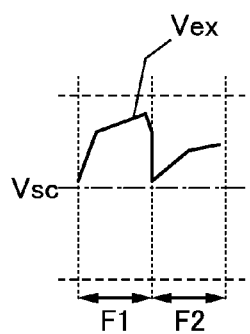
FIGS. 1B1 and 1B2 are schematic views of signals.
Figures 1, 1B, 2:
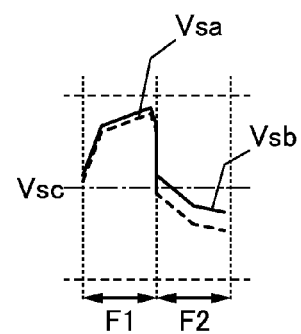

FIG. 1A is a block diagram illustrating a display device of one embodiment of the present invention, and FIGS. 1B1 and 1B2 are schematic views of signals.

Figure 2A:
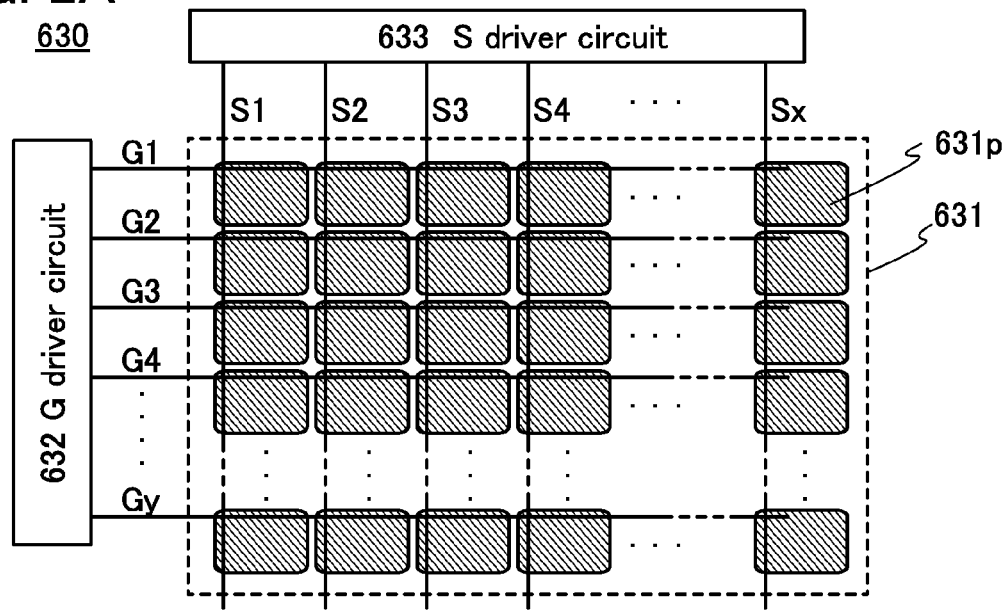
FIGS. 2A and 2B illustrate a structure of a display portion in a display device of an embodiment.
Figure 2B:
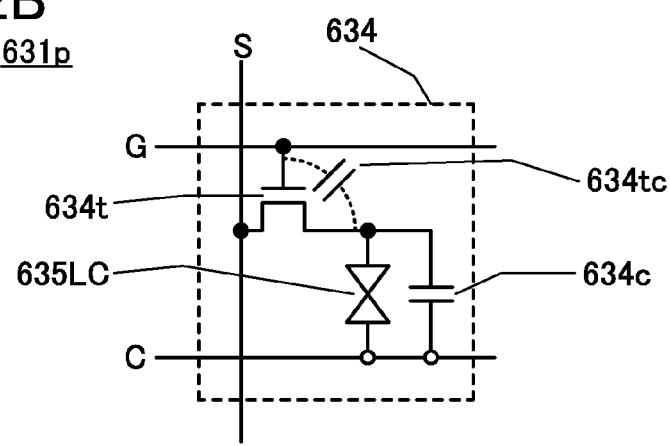

FIGS. 2A and 2B illustrate a structure of a display portion included in a display device of one embodiment of the present invention.

<1. Structure of Display Device 640>

A display device 640 includes a display portion 630 and a control portion 610 (see FIG. 1A).

<<Structure of Display Portion>>

The display portion 630 includes a pixel portion 631 and a G driver circuit 632 (see FIG. 2A).

Display light of the display portion 630 does not include light with a wavelength shorter than 420 nm. The pixel portion 631 includes a plurality of pixels 631p arranged at a resolution of 150 ppi or more, a plurality of scan lines G (G1 to Gy) supplying G signals to the plurality of pixels 631p row by row, and a plurality of signal lines S (S1 to Sx) supplying S signals to the plurality of pixels 631p column by column.

The G driver circuit 632 can supply a G signal 632_G (see FIG. 1A).

The pixel 631p includes a display element 635 and a pixel circuit 634 including the display element 635.

In this embodiment, as an example of the pixel circuit 634, a structure in which a liquid crystal element 635LC is used as the display element 635 is illustrated in FIG. 2B.

The pixel circuit 634 includes a transistor 634t including a gate electrode to which the G signal is input and a first electrode to which the S signal is input, and the liquid crystal element 635LC including a first electrode electrically connected to a second electrode of the transistor 634t and a second electrode to which a common potential is supplied.

<<Structure of Control Portion>>

The control portion 610 has a function of outputting a secondary image signal 615_V to the display portion 630. The control portion 610 also has a function of outputting a secondary control signal 615_C including a scan start signal to the G driver circuit 632.

The control portion 610 includes a feedthrough correction circuit 611 and a polarity determination circuit 612 which determines a polarity of the secondary image signal 615_V.

The feedthrough correction circuit 611 has a function of correcting the amplitude of a primary image signal 625_V including one piece of grayscale information so that feedthrough to be caused is compensated and outputting the corrected signal as the secondary image signal 615_V.

In the display device 640 described in this embodiment, the amount of feedthrough can be estimated and a secondary image signal which is generated from the primary image signal corrected in advance can be supplied. Thus, a display element can be put in a predetermined display state by the potential of the S signal after generation of the feedthrough. Consequently, a novel display device capable of displaying images with less flicker can be provided. Further, a display device capable of displaying eye-friendly still images can be provided.

Elements included in the display device of one embodiment of the present invention will be described below in detail.

<2. Signals Used in Display Device 640>

A primary control signal 625_C and the primary image signal 625_V can be externally input to the display device 640.

The primary control signal 625_C includes a signal for controlling the timing of scan operation of the display device 640, for example.

The primary image signal 625_V includes grayscale information (also can be referred to as luminance information) and chromaticity information on an image, for example.

The secondary image signal 615_V includes grayscale information on an image and the like. The secondary image signal 615_V is generated from the primary image signal 625_V. For example, the secondary image signal 615_V can be a signal whose amplitude is a difference between the potential of the primary image signal 625_V and a reference potential Vsc and whose polarity is inverted every frame. The secondary image signal 615_V is input to the display portion 630 to be supplied to an S driver circuit 633.

The secondary control signal 615_C includes an S driver circuit start pulse signal SP, an S driver circuit clock signal CK, and a latch signal LP that control the operation of the S driver circuit 633; a G driver circuit start pulse SP, a G driver circuit clock signal CK, and a pulse width control signal PWC that control the operation of the G driver circuit 632; and the like. The secondary control signal 615_C is supplied to the S driver circuit 633 and the G driver circuit 632 together with power supply potential and the like.

The G signal is generated from the secondary control signal 615_C by the G driver circuit 632. The G signal is output to the pixels 631p row by row to select the pixels 631p row by row.

The S signal includes grayscale information on an image and the like. The S signal is generated from the secondary image signal 615_V by the S driver circuit 633. The S signal is output to the pixel 631p selected by the G signal.

<3. Details of Structure of Display Portion>

The kinds and number of the wirings in the pixel portion 631 can be determined by the structure, number, and position of the pixels 631p. For example, in the pixel portion 631 illustrated in FIG. 2A, the pixels 631p are arranged in a matrix of x columns and y rows, and the signal lines S1 to Sx and the scan lines G1 to Gy are provided in the pixel portion 631.

The G driver circuit 632 can control input of the G signals to the scan lines G on a row basis.

The display portion 630 may include the S driver circuit 633. The S driver circuit 633 can control input of the S signals to the signal lines S.

<<3-1. Pixel Circuit>>

The structure of the pixel circuit 634 can be selected in accordance with the kind or the driving method of the display element 635.

The pixel circuit 634 includes the transistor 634t for controlling supply of the S signal 633_S to the display element 635.

A gate of the transistor 634t is connected to any one of the scan lines G1 to Gy. One of a source and a drain of the transistor 634t is connected to any one of the signal lines S1 to Sx. The other of the source and the drain of the transistor 634t is connected to the first electrode of the display element 635.

In the pixel 631p, one transistor 634t is used as a switching element for controlling input of the S signal 633_S to the pixel 631p. Alternatively, a plurality of transistors which serve as one switching element may be used in the pixel 631p. In that case, the plurality of transistors serving as one switching element may be connected to each other in parallel, in series, or in combination of parallel connection and series connection.

Note that the pixel 631p may further include a capacitor 634c for holding voltage between the first electrode and a second electrode of the liquid crystal element 635LC and another circuit element such as a transistor, a diode, a resistor, a capacitor, or an inductor as needed.

The capacitance of the capacitor 634c may be adjusted as appropriate. For example, in the second mode described later, the capacitor 634c is provided in the case where the S signal 633_S is held for a relatively long period (specifically, 1/60 sec or longer). It is also possible to adjust the capacitance of the pixel circuit 634 with use of a structure other than the capacitor 634c. For example, a virtual capacitor may be formed by a structure in which the first electrode and the second electrode of the liquid crystal element 635LC are provided to overlap with each other.

<<3-2. Transistor>>

The transistor 634t controls whether to apply the potential of the signal line S to the first electrode of the display element 635. A predetermined common potential Vcom is applied to the second electrode of the display element 635.

Note that a transistor including an oxide semiconductor can be suitably used as the transistor in the display device of one embodiment of the present invention. Embodiment 6 can be referred to for details of the transistor including an oxide semiconductor.

<<3-3. Display Element>>

Besides the liquid crystal element 635LC, any of a variety of display elements such as an OLED element generating luminescence (electroluminescence) when voltage is applied thereto and electronic ink utilizing electrophoresis can be used as the display element 635.

Here, for example, the polarized light transmittance of the liquid crystal element 635LC can be controlled by the potential of the S signal 633_S; thus, gradation can be expressed.

<<3-4. Light Supply Portion>>

A light supply portion 650 includes a light source. The control portion 610 controls driving of the light source in the light supply portion 650.

The light source in the light supply portion 650 can be a cold cathode fluorescent lamp, a light-emitting diode (LED), an OLED element, or the like.

In particular, the intensity of blue light emitted by the light source is preferably weakened compared to that of light of any other color. Blue light included in light emitted by the light source reaches the retina of the eye without being absorbed by the cornea or the lens. Accordingly, weakening the intensity of blue light emitted by the light source compared to that of light of any other color makes it possible to reduce long-term effects of blue light on the retina (e.g., age-related macular degeneration), adverse effects of exposure to blue light until midnight on the circadian rhythm, and the like. Specifically, it is preferable to use a light source which does not emit light with wavelengths shorter than or equal to 400 nm, preferably shorter than or equal to 420 nm, more preferably shorter than or equal to 440 nm (such light is also referred to as UVA).

<4. Details of Control Portion 610>

The function of the control portion 610 is described with reference to FIGS. 1A, 1B1, and 1B2 and FIGS. 3A to 3D. The control portion 610 generates a secondary image signal from a primary image signal.

FIG. 1B1 schematically shows a potential Vex of the primary image signal 625_V input to the display device 640 of one embodiment of the present invention. Note that Vsc is the reference potential.

FIG. 1B2 schematically shows a potential Vsb of the secondary image signal 615_V output from the control portion 610. Note that a potential Vsa is the potential of a signal obtained by inverting the polarity of the primary image signal 625_V every frame. The signal obtained by inverting the polarity of the primary image signal 625_V every frame is corrected so that feedthrough is compensated; thus, the secondary image signal 615_V is obtained.

<<Method for Generating S Signal from Primary Image Signal>>

Figure 3A:
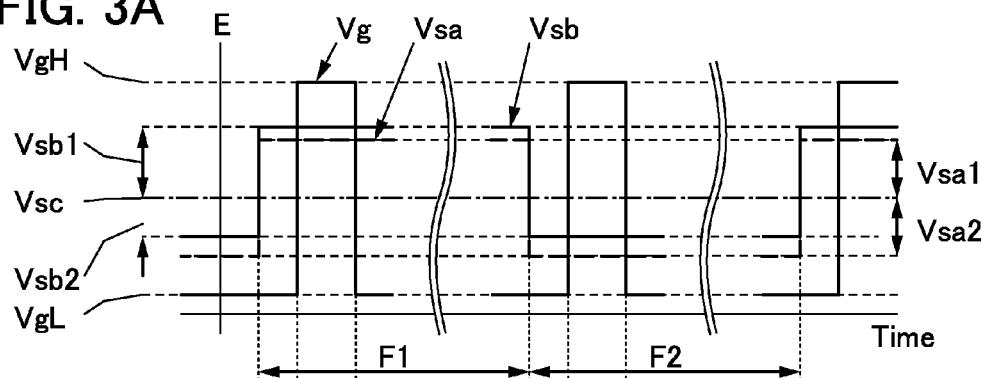
FIGS. 3A to 3D are timing charts and a schematic view showing operations of a control portion in a display device of an embodiment.

FIGS. 3A to 3D are timing charts and a schematic view showing the operation of the control portion 610 included in the display portion 630 of one embodiment of the present invention. FIG. 3A is a timing chart of a potential Vg of the G signal input to the gate electrode of the transistor 634t of the pixel circuit 634 and a potential Vsa of the S signal input to the first electrode of the transistor 634t. Note that the potential Vg is VgH when the G signal is high, and is VgL when the G signal is low. A first frame F1 and a second frame F2 following the first frame F1 are shown.

<<Step of Determining Polarity of Secondary Image Signal>>

The polarity of the secondary image signal 615_V is inverted every frame. The polarity of the secondary image signal 615_V is determined by the polarity determination circuit 612. For example, the polarity is determined so that the potential of the secondary image signal 615_V is positive with respect to the reference potential Vsc in the first frame F1 and is negative with respect to the reference potential Vsc in the second frame F2.

FIG. 3A shows the potential Vsa of a signal whose amplitude is a difference between the reference potential Vsc and the potential of the primary image signal 625_V and whose polarity is inverted every frame. This signal has an amplitude of a voltage Vsa1 on the positive side with respect to the reference potential Vsc and an amplitude of a voltage Vsa2 on the negative side with respect to the reference potential Vsc.

<<Step of Correction for Compensating Feedthrough>>

The feedthrough correction circuit 611 corrects the amplitude of the primary image signal 625_V with respect to the reference potential Vsc and determines the amplitude of the secondary image signal 615_V. Note that the feedthrough correction circuit 611 may correct the amplitude of the primary image signal 625_V including one piece of grayscale information only in a period during which the polarity is positive or only in a period during which the polarity is negative, or in both the periods.

A method for keeping the polarized light transmittance of the liquid crystal element 635LC constant for two or more frames is described. This method can be applied to the case of displaying a still image, for example.

Note that in the case described in this embodiment, the feedthrough caused when the polarity of the secondary image signal is negative is greater (i.e., the amount of voltage drop is larger) than that caused when the polarity of the secondary image signal is positive.

The feedthrough correction circuit 611 corrects the primary image signal so that the amplitude of the secondary image signal is smaller when the polarity is negative than when the polarity is positive. The feedthrough correction circuit 611 amplifies the amplitude (voltage Vsa1) of the primary image signal 625_V with respect to the reference potential Vsc in a period during which the polarity is positive (e.g., the first frame F1) and attenuates the amplitude (voltage Vsa2) of the primary image signal 625_V with respect to the reference potential Vsc in a period during which the polarity is negative (e.g., the second frame F2). Specifically, the feedthrough correction circuit 611 amplifies the voltage Vsa1 to a voltage Vsb1, and attenuates the voltage Vsa2 to a voltage Vsb2 (see FIG. 3A).

<<Method for Estimating Amount of Feedthrough>>

Feedthrough is caused owing to the parasitic capacitance of the transistor 634t. Accordingly, the amount of feedthrough can be estimated by calculation. It is also possible to obtain, from empirical data, the amount of feedthrough on the basis of the piece of grayscale information included in the primary image signal 625_V. Further, a correction value based on the amount of feedthrough which is estimated or calculated in advance can be stored in a lookup table or the like so that a correction value corresponding to the grayscale information can be looked up.

When the polarity determined by the polarity determination circuit is positive, the first feedthrough $\Delta V1$ of the S signal with an amplitude of VS1 can be calculated using the high potential VgH of the G signal, the reference potential Vsc for the S signal, the threshold voltage Vth of the transistor 634t, and the function represented by the formula (1).

When the polarity determined by the polarity determination circuit is negative, the second feedthrough $\Delta V2$ of the S signal with an amplitude of VS2 can be calculated using the high potential VgH of the G signal, the reference potential Vsc for the S signal, the threshold voltage Vth of the transistor 634t, and the function represented by the formula (2).

Figure 4A:
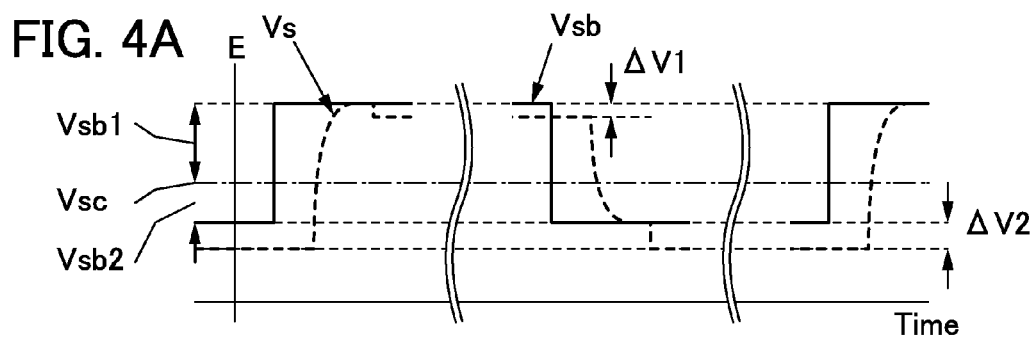
FIGS. 4A to 4C schematically show the relation between S signals with various amplitudes and the amounts of feedthrough of the S signals.
Figure 4B:
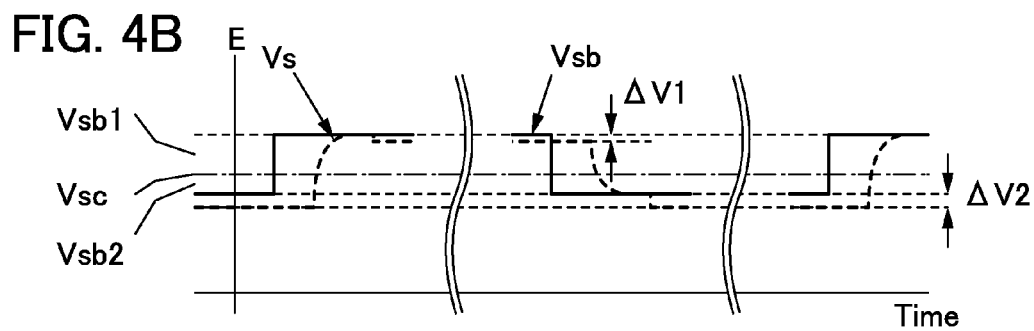
Figure 4C:
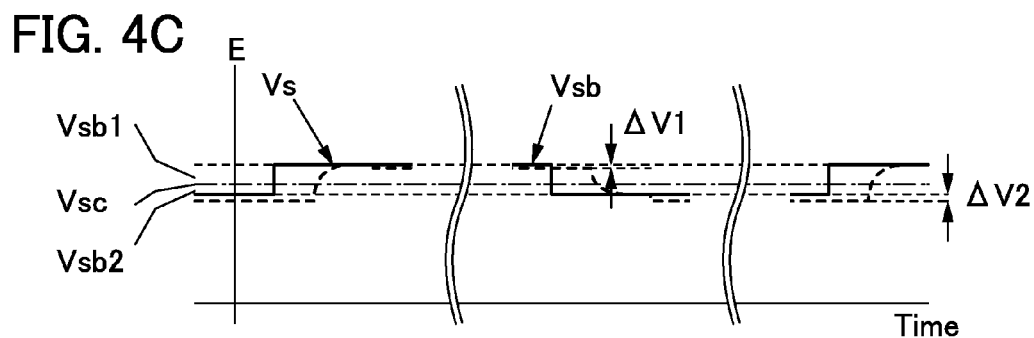

FIGS. 4A to 4C schematically show the relation between S signals with various amplitudes and the amounts of feedthrough of the S signals. FIGS. 4A to 4C are timing charts each of which shows the relation between the potential Vsb of the secondary image signal 615_V which is generated from the primary image signal 625_V corrected so that feedthrough to be caused is compensated and the potential Vs of the second electrode of the transistor 934t to which the secondary image signal 615_V is input. The positive amplitude (voltage Vsa1) of the secondary image signal 615_V is the largest in FIG. 4A and the smallest in FIG. 4C. The first feedthrough $\Delta V1$ and the second feedthrough $\Delta V2$ are each the largest in FIG. 4A and the smallest in FIG. 4C. Accordingly, the correction value for compensating the feedthrough is the largest in FIG. 4A and the smallest in FIG. 4C. As a result, the reference potential Vsc serves as a reference for the amplitude of the potential Vs of the second electrode of the transistor 934t after feedthrough occurs in all the timing charts.

The second feedthrough $\Delta V2$ of the S signal having a negative polarity is in some cases greater than the first feedthrough $\Delta V1$ of the S signal having a positive polarity. Further, when the amounts of feedthrough of the S signals having the same polarity are compared, the feedthrough of the S signal with a large amplitude is in some cases greater than the feedthrough of the S signal with a small amplitude.

The potential Vs is the potential of the second electrode of the transistor 634t, which is input to the first electrode of the liquid crystal element 635LC.

The common potential Vcom is input to the second electrode of the liquid crystal element 635LC. Note that the common potential Vcom may be constant or may be changed. For example, the common potential Vcom may be changed alternately every frame (i.e., what is called inversion driving may be performed).

The liquid crystal element 635LC is driven with AC voltage. Thus, deterioration of a liquid crystal layer of the liquid crystal element 635LC can be prevented.

<<Image Based on Secondary Image Signal Displayed on Display Portion>>

The S driver circuit 633 generates the S signal 633_S from the secondary image signal 615_V. In this embodiment, the potential of the S signal 633_S generated by the S driver circuit 633 is equal to the potential Vsb of the secondary image signal 615_V.

Figure 3B:
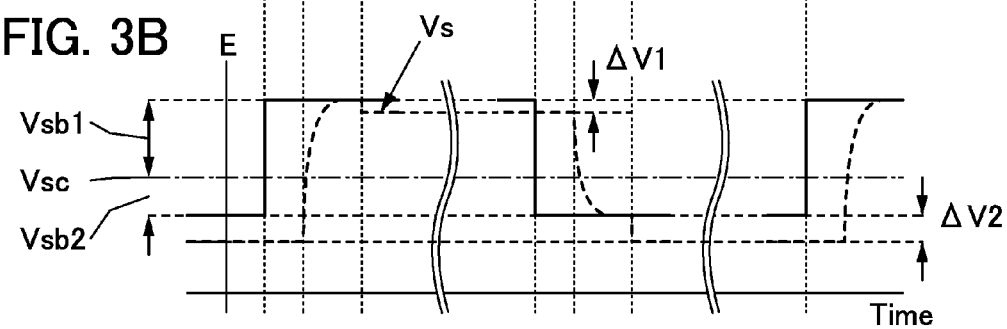

The S signal 633_S is supplied to the pixel 631p selected by the G signal 632_G, and feedthrough is caused in the transistor 634t (see FIG. 3B).

The secondary image signal 615_V is generated in such a manner that the primary image signal is corrected so that the amplitude of the secondary image signal is increased when its polarity is positive. Conversely, the action of the first feedthrough $\Delta V1$ decreases the amplitude. Thus, when the secondary image signal 615_V combines with the first feedthrough ΔV1, the first feedthrough ΔV1 can be compensated.

The secondary image signal 615_V is generated in such a manner that the primary image signal is corrected so that the amplitude of the secondary image signal is decreased when its polarity is negative. Conversely, the action of the second feedthrough ΔV2 increases the amplitude. Thus, when the secondary image signal 615_V combines with the second feedthrough ΔV2, the second feedthrough ΔV2 can be compensated.

Figure 3C:
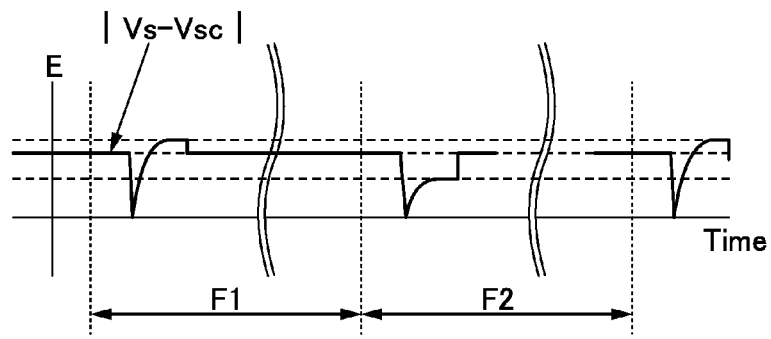

As a result, the magnitude |Vs−Vsc|, a difference between the reference potential Vsc and the potential Vs of the second electrode of the transistor 634t, can be substantially constant regardless of the polarity of the secondary image signal 615_V (see FIG. 3C).

Figure 3D:
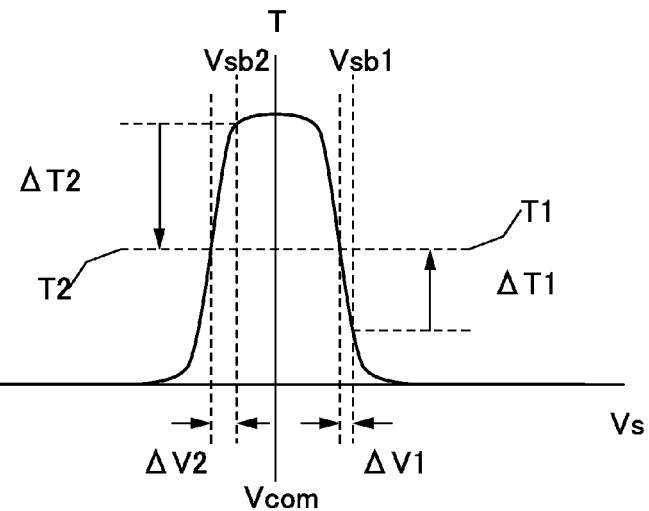

FIG. 3D schematically shows the relation between a potential for driving the liquid crystal element 635LC and the polarized light transmittance of the liquid crystal element 635LC. Note that FIG. 3D shows the potential Vsb1 of the secondary image signal 615_V having a positive polarity and the potential Vsb2 of the secondary image signal 615_V having a negative polarity. FIG. 3D also shows a potential lowered from the potential Vsb1 by the first feedthrough ΔV1 and a potential lowered from the potential Vsb2 by the second feedthrough ΔV2.

As described above, the feedthrough correction circuit 611 corrects the primary image signal 625_V in accordance with the polarity determined by the polarity determination circuit 612; thus, the polarized light transmittance of the liquid crystal element 635LC can be kept constant.

Note that in this embodiment, the primary image signal is corrected so that predicted feedthrough is compensated; however, one embodiment of the present invention is not limited thereto. In some cases or depending on the situation, it is possible that the primary image signal is not corrected in such a manner.

Note that this embodiment can be combined with any of the other embodiments in this specification as appropriate.
(Embodiment 2)

In this embodiment, a structure of an information processing device of one embodiment of the present invention will be described with reference to FIGS. 5A and 5B, FIGS. 6A and 6B, and FIG. 7.

Specifically, description is given on an information processing device which has a first mode in which a G signal for selecting a pixel is output at a rate of 30 Hz (30 times per second) or more, preferably more than or equal to 60 Hz (60 times per second) and less than 960 Hz (960 times per second) and a second mode in which the G signal is output at a rate of more than or equal to 11.6 μHz (once per day) and less than 0.1 Hz (0.1 times per second), preferably more than or equal to 0.28 mHz (once per hour) and less than 1 Hz (once per second).

When a still image is displayed with this information processing device, the refresh rate can be set to less than 1 Hz, preferably less than or equal to 0.2 Hz. This enables eye-friendly display, i.e., display which causes less eye fatigue of a user or display which does not put strain on the user's eyes. Further, a display image can be refreshed at an optimal rate in accordance with the quality of the image displayed on the display portion. Specifically, in displaying a still image, the refresh rate can be set lower than in displaying a smooth moving image; thus, a still image with less flicker can be displayed and power consumption can be reduced.

Figure 5A:
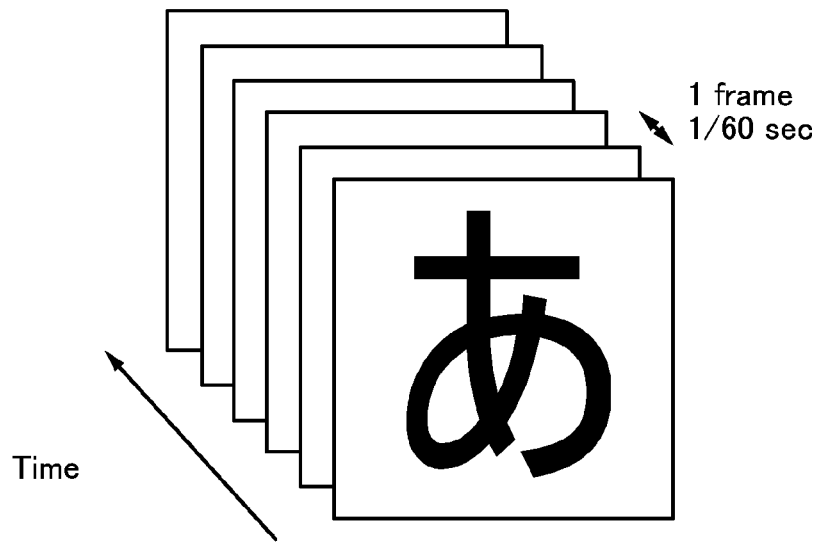
FIGS. 5A and 5B are views for explaining nervous asthenopia.
Figure 5B:
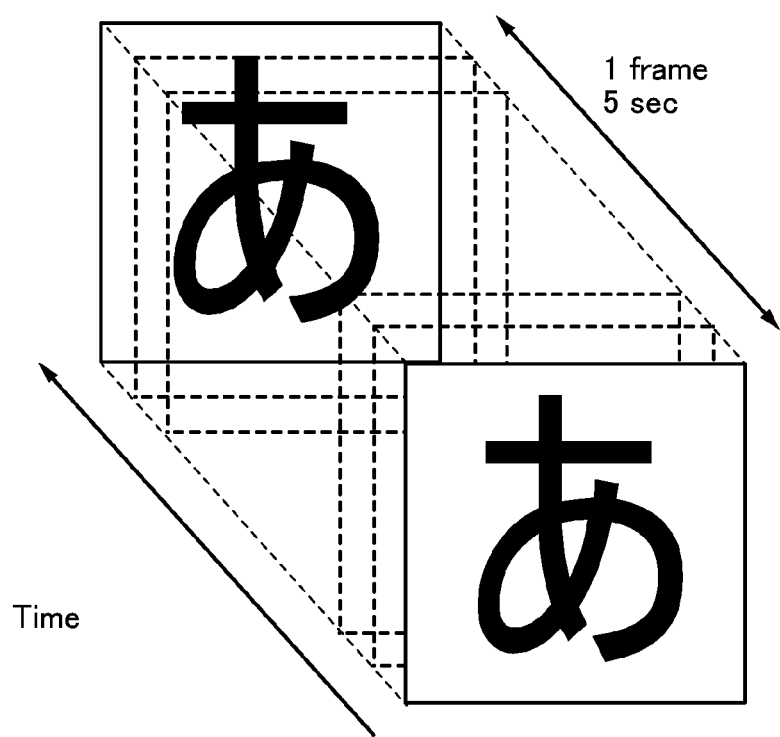

FIGS. 5A and 5B are views for explaining nervous asthenopia.

Figure 6A:
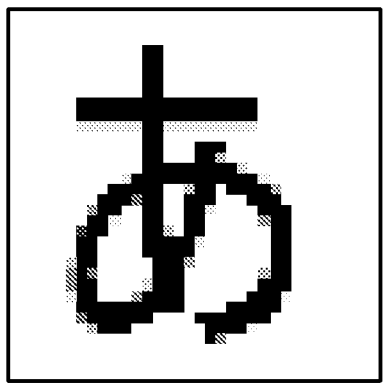
FIGS. 6A and 6B are views for explaining muscular asthenopia.
Figure 6B:
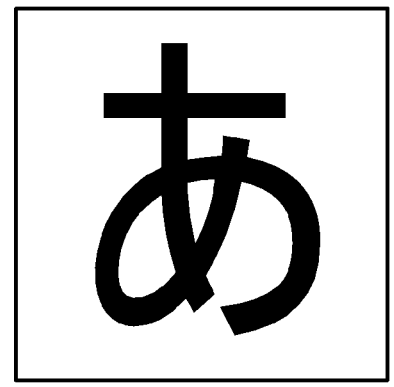

FIGS. 6A and 6B are views for explaining muscular asthenopia.

Figure 7:
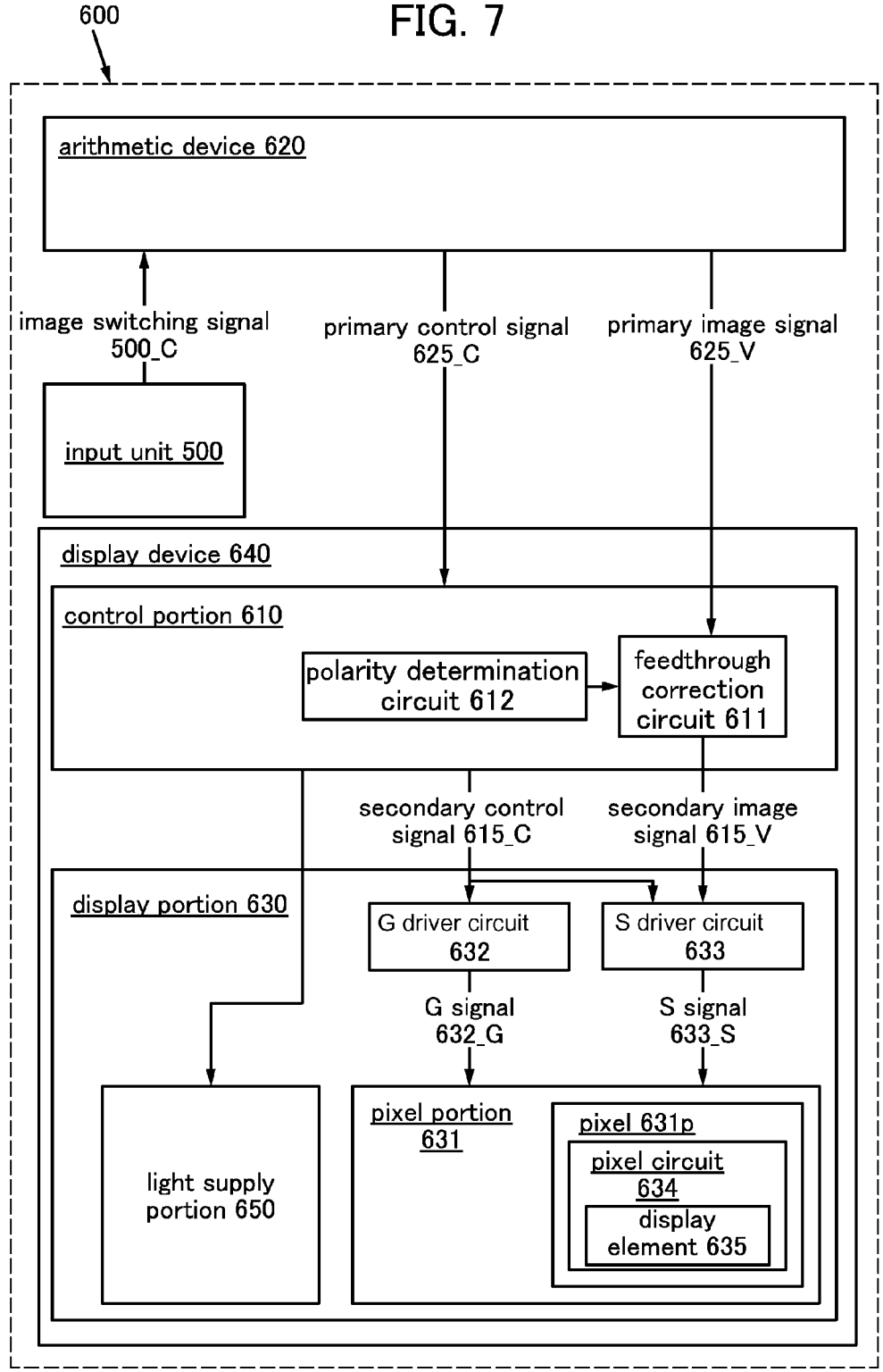
FIG. 7 is a block diagram illustrating a structure of an information processing device with a display function of an embodiment.

FIG. 7 is a block diagram of a structure of an information processing device with a display function of one embodiment of the present invention.
<Eye Fatigue>

Here, eye fatigue is described. Eye fatigue is classified into two categories: nervous asthenopia and muscular asthenopia.

Nervous asthenopia is caused when a user keeps looking at continuous or blinking light emitted from a display portion for a long time. This is because the brightness stimulates and fatigues the retina or nerve of the eye or the brain. Frequent blinking of fluorescent light or a display portion of a conventional display device, which is called flicker, causes nervous asthenopia.

Muscular asthenopia is fatigue caused by overuse of the ciliary muscle, which is used to adjust the focus.

FIG. 5A is a schematic view showing display on a conventional display portion. An image is rewritten 60 times per second in display on the conventional display portion. When a user keeps looking at such display for a long time, the retina or nerve of the eye or the brain may be stimulated and eye fatigue might be caused as a result.

FIG. 5B schematically shows display of an information processing device described in this embodiment. In the information processing device in this embodiment, the rate at which the G signal for selecting a pixel is output can be changed. In particular, a transistor with extremely low off-state current is used in a pixel portion of a display portion; thus, frame frequency can be lowered while flicker is reduced. For example, an image can be rewritten as less frequently as once every five seconds. This enables the user to see the same one image as long as possible, so that flicker on the screen recognized by the user is reduced. Thus, stimuli to the retina or nerve of the eye or the brain of the user are reduced, and nervous asthenopia is reduced accordingly.

Note that a transistor including an oxide semiconductor, particularly a transistor including a CAAC-OS is suitably used as a transistor with extremely low off-state current.

In addition, as shown in FIG. 6A, when the size of each pixel is large (for example, when the resolution is less than 150 ppi), a character displayed on the display portion is blurred. When a user keeps looking at a blurred character displayed on the display portion for a long time, it remains difficult to focus the eye on the character even though the ciliary muscle constantly moves in order to focus the eye, which might put strain on the eye.

In contrast, as shown in FIG. 6B, the information processing device of one embodiment of the present invention is capable of display with a resolution as high as 150 ppi or more, preferably 200 ppi or more because the size of each pixel is small; thus, smooth, high-resolution images can be displayed. In this case, the ciliary muscle can easily focus the eye on the character, so that the user's muscular asthenopia is reduced. Note that resolution can be expressed by pixel density (pixel per inch (ppi)). Pixel density is the number of pixels per inch. A pixel is a unit composing an image.

Methods for quantitatively measuring eye fatigue have been studied. For example, critical flicker (fusion) frequency (CFF) is known as an indicator for evaluating nervous asthenopia. Further, accommodation time, near point distance, and the like are known as indicators for evaluating muscular asthenopia.

Others methods for evaluating eye fatigue include electroencephalography, thermography, counting the number of times of blinking, measuring tear volume, measuring the speed of contractile response of the pupil, and questionnaires for surveying subjective symptoms.

<1. Structure of Information Processing Device>

An information processing device 600 with a display function, which is described in this embodiment, includes a display portion 630, a control portion 610, an arithmetic device 620, and an input unit 500 (see FIG. 7).

The display portion 630 includes the pixel portion 631, the first driver circuit (S driver circuit) 633, and the second driver circuit (G driver circuit) 632. The structure described in Embodiment 1 can be applied to the display portion 630. Here, refer to Embodiment 1 for description of portions similar to those in Embodiment 1.

The S driver circuit outputs the first driving signal (S signal) 633_S to the pixel circuit 634. The G driver circuit outputs the second driving signal (G signal) 632_G for selecting the pixel circuit 634 to the pixel circuit 634.

The G driver circuit 632 has a first mode of outputting the G signal 632_G for selecting a scan line to each scan line at a rate of 30 Hz (30 times per second) or more, preferably more than or equal to 60 Hz (60 times per second) and less than 960 Hz (960 times per second) and a second mode of outputting the G signal 632_G to each scan line at a rate of more than or equal to 11.6 μHz (once per day) and less than 0.1 Hz (0.1 times per second), preferably more than or equal to 0.28 mHz (once per hour) and less than 1 Hz (once per second).

Note that the G driver circuit 632 is switched between the first mode and the second mode in response to a mode switching signal which is input.

The pixel portion 631 includes the plurality of pixels 631p. The pixels 631p includes the respective pixel circuits 634. The pixel circuits 634 hold the S signals 633_S input and include the display elements 635 which display an image in the pixel portion 631 in accordance with the S signals 633_S.

The arithmetic device 620 outputs the primary control signal 625_C and the primary image signal 625_V.

The control portion 610 controls the S driver circuit 633 and the G driver circuit 632.

In the case where a liquid crystal element is used as the display element 635, the light supply portion 650 is provided in the display portion 630. The light supply portion 650 supplies light to the pixel portion 631 including the liquid crystal element, and functions as a backlight.

In the information processing device 600 with a display function, the rate of selecting one from a plurality of pixel circuits 634 in the pixel portion 631 can be changed by the G signal 632_G output from the G driver circuit 632. Consequently, the information processing device 600 can have a display function which is less likely to cause eye fatigue of a user.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Note that in this specification, a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

Note that in this specification, a state in which transistors are connected to each other in series means, for example, a state in which only one of a source and a drain of a first transistor is connected to only one of a source and a drain of a second transistor. In addition, a state in which transistors are connected to each other in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, a connection state means not only a state of direct connection but also a state of indirect connection through a circuit element such as a wiring, a resistor, a diode, or a transistor so that current, voltage, or a potential can be supplied or transmitted.

In this specification, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Elements included in the information processing device with a display function of one embodiment of the present invention are described below.

<2. Arithmetic Device>

The arithmetic device 620 generates the primary image signal 625_V and the primary control signal 625_C including a mode switching signal.

For example, the arithmetic device 620 may be configured to output the primary control signal 625_C including the mode-switching signal in accordance with an image-switching signal 500_C output from the input unit 500.

When the primary control signal 625_C including a mode switching signal is input to the G driver circuit 632 in the second mode, the G driver circuit 632 is switched from the second mode to the first mode and outputs the G signal at least once, then being switched to the second mode.

For example, the input unit 500 may be configured to output the image-switching signal 500_C to the arithmetic device 620 when sensing a page turning operation.

The arithmetic device 620 generates the primary image signal 625_V including the page turning operation and outputs the primary image signal 625_V as well as the primary control signal 625_C including a mode switching signal.

The control portion 610 outputs the secondary control signal 615_C including the mode switching signal to the G driver circuit 632 and outputs the secondary image signal 615_V including the page turning operation to the S driver circuit 633.

The G driver circuit 632 is switched from the second mode to the first mode and outputs the G signal 632_G at a rate high enough to prevent a change in image due to signal rewrite operation from being recognized by a user, whereby an image is rewritten.

Meanwhile, the S driver circuit 633 outputs to the pixel circuits 634 the S signals 633_S generated from the secondary image signal 615_V.

In this manner, many frame images including the page turning operation can be displayed at high rate by the pixels 631p; thus, smooth images based on the secondary image signals 615_V including the page turning operation can be displayed.

The arithmetic device 620 may be configured to determine whether an image based on the primary image signals 625_V to be output to the display portion 630 is a moving image or a still image. For example, the arithmetic device 620 outputs a switching signal selecting the first mode when the image based on the primary image signals 625_V is a moving image and outputs a switching signal selecting the second mode when the image based on the primary image signals 625_V is a still image.

A method for determining whether the image based on the primary image signals is a moving image or a still image is as follows. Signals for one frame included in the primary image signals 625_V are compared with signals for the pervious frame and signals for the next frame, whereby differences are obtained. It is determined that the image is a moving image when the differences are each greater than a predetermined difference, and it is determined that the image is a still image in other cases.

When the control portion 610 switches the operating mode of the G driver circuit 632 from one mode to another mode (e.g., from the second mode to the first mode), the G driver circuit 632 may be configured to output the G signals 632_G one or more predetermined times, and then be switched to the other mode.

<3. Control Portion>

The control portion 610 generates the secondary image signal 615_V from the primary image signal 625_V and outputs the secondary image signal 615_V (see FIG. 7).

The control portion 610 generates the secondary control signal 615_C from the primary control signal 625_C including a synchronization signal (e.g., a vertical synchronization signal or a horizontal synchronization signal). The secondary control signal 615_C includes, for example, a start pulse signal SP, a latch signal LP, a pulse width control signal PWC, and a clock signal CK.

The control portion 610 includes the polarity determination circuit 612. The polarity determination circuit 612 notifies the timing at which the polarity of the secondary image signal 615_V is to be inverted; accordingly, the control portion 610 may be configured to invert the polarity of the secondary image signal 615_V at the notified timing. Note that the polarity of the secondary image signal 615_V may be inverted in the control portion 610, or may be inverted in the display portion 630 in accordance with an instruction from the control portion 610.

The polarity determination circuit 612 has a function of determining the timing of inverting the polarity of the secondary image signal 615_V by using a synchronization signal. For example, the polarity determination circuit 612 in this embodiment includes a counter and a signal generator circuit.

The counter has a function of counting the number of frames by using the pulse of a horizontal synchronizing signal.

The signal generator circuit may have a function of notifying the timing of inverting the polarity of the secondary image signal 615_V to the control portion 610 so that the polarity of the secondary image signal 615_V is inverted every several consecutive frames by using information on the number of frames obtained by the counter.

<4. Input Unit>

As the input unit 500, a touch panel, a touch pad, a mouse, a finger joystick, a trackball, a data glove, or an imaging device can be used, for example. In the arithmetic device 620, an electric signal output from the input unit 500 can be associated with coordinates of a display portion. Accordingly, a user can input an instruction for processing information displayed on the display portion.

Examples of information input with the input unit 500 by a user are instructions for dragging an image displayed on the display portion to another position on the display portion; for swiping a screen for turning a displayed image and displaying the next image; for scrolling a continuous image; for selecting a specific image; for pinching a screen for changing the size of a displayed image; and for inputting handwritten characters.

Note that this embodiment can be combined with any of the other embodiments in this specification as appropriate.

(Embodiment 3)

In this embodiment, an example of a method for driving the display portion shown in Embodiment 1 will be described with reference to FIG. 8 and FIG. 9.

Specifically, description is given on a method for driving an information processing device which has a first mode in which a G signal for selecting a pixel is output at a rate of 30 Hz (30 times per second) or more, preferably more than or equal to 60 Hz (60 times per second) and less than 960 Hz (960 times per second) and a second mode in which the G signal is output at a rate of more than or equal to 11.6 μHz (once per day) and less than 0.1 Hz (0.1 times per second), preferably more than or equal to 0.28 mHz (once per hour) and less than 1 Hz (once per second).

Figure 8:
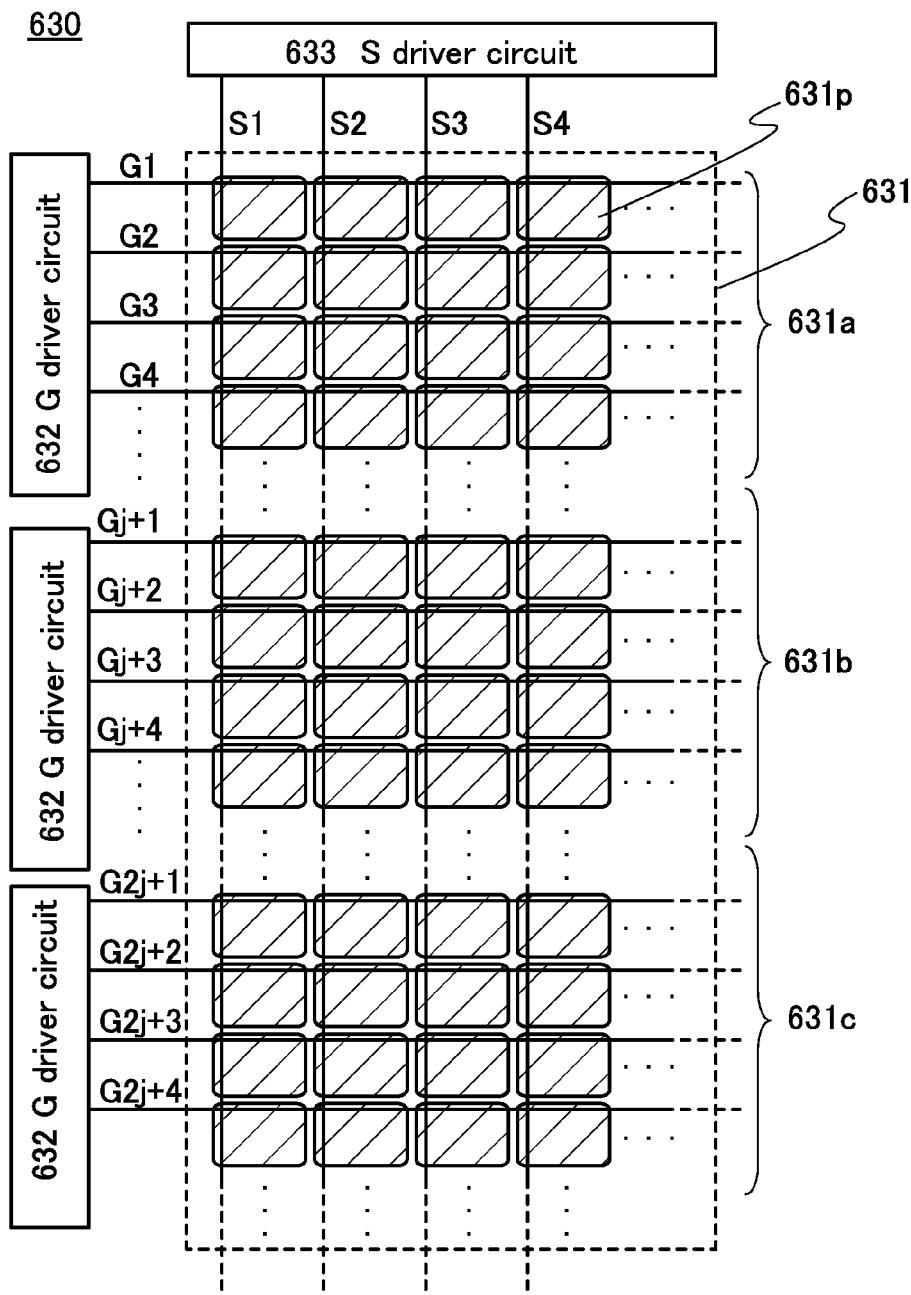
FIG. 8 is a block diagram illustrating a modification example of a structure of a display portion of an embodiment.

FIG. 8 is a block diagram illustrating a modification example of a structure of a display portion of one embodiment of the present invention.

Figure 9:
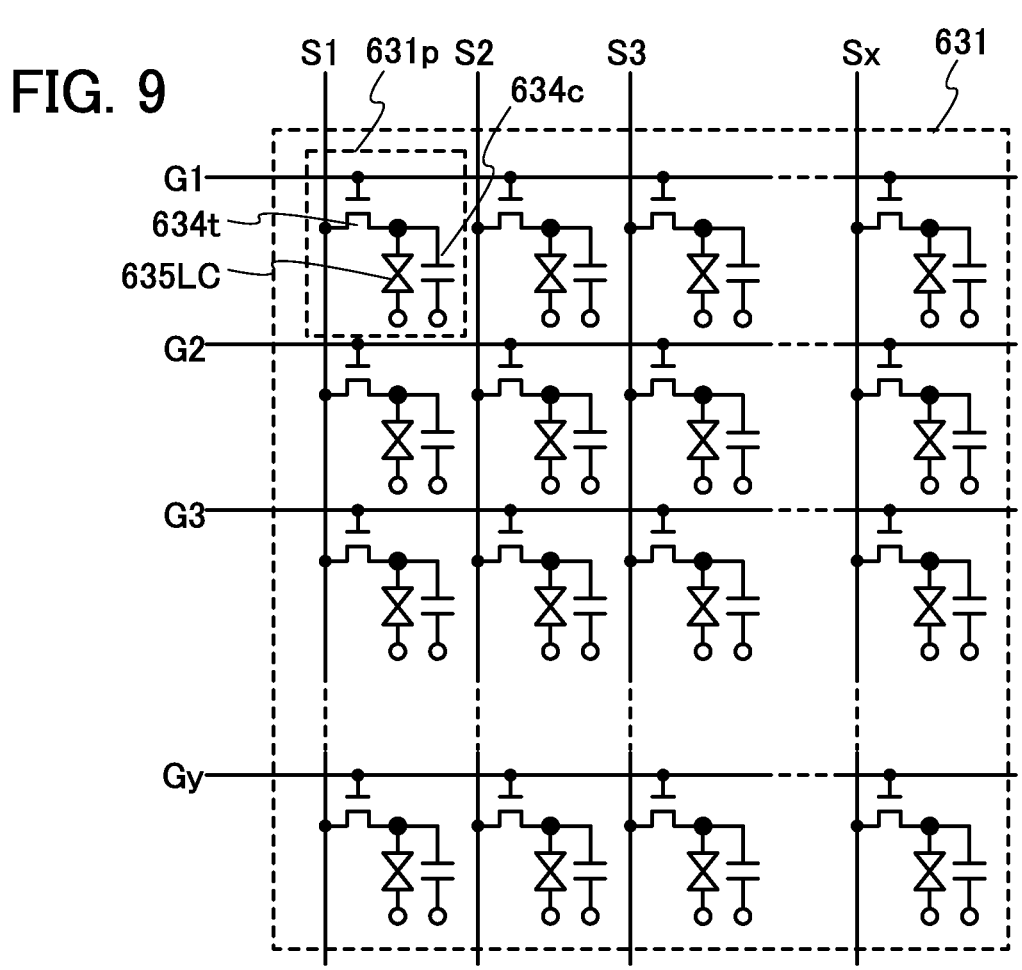
FIG. 9 is a circuit diagram illustrating a display portion of an embodiment.

FIG. 9 is a circuit diagram illustrating a display portion of one embodiment of the present invention.

In this embodiment, a method for displaying images at a rate of 1 Hz or less in the display device described in Embodiment 1 is described.

<1. Method for Writing S Signal into Pixel Portion>

An example of a method for writing the S signals 633_S into the pixel portion 631 in FIG. 2A or FIG. 8 is described. Specifically, the method described here is a method for writing the S signal 633_S into each pixel 631p including the pixel circuit illustrated in FIG. 2B in the pixel portion 631.

<Writing Signals into Pixel Portion>

In a first frame, the scan line G1 is selected by input of the G signal 632_G with a pulse to the scan line G1. In each of the plurality of pixels 631p connected to the selected scan line G1, the transistor 634t is turned on.

When the transistors 634t are on (in one line period), the potentials of the S signals 633_S generated from the secondary image signals 615_V are applied to the signal lines S1 to Sx. Through each of the transistors 634t that are on, charge corresponding to the potential of the S signal 633_S is accumulated in the capacitor 634c and the potential of the S signal 633_S is applied to a first electrode of the liquid crystal element 635LC.

In a period during which the scan line G1 is selected in the first frame, the S signals 633_S having a positive polarity are sequentially input to all the signal lines 51 to Sx. Thus, the S signals 633_S having a positive polarity are input to first electrodes G1S1 to G1Sx in the pixels 631p that are connected to the scan line G1 and the signal lines S1 to Sx.

Accordingly, the transmittance of the liquid crystal element 635LC is controlled by the potential of the S signal 633_S; thus, gradation is expressed by the pixels.

Similarly, the scan lines G2 to Gy are sequentially selected, and the pixels 631p connected to the scan lines G2 to Gy are sequentially subjected to the same operation as that performed while the scan line G1 is selected. Through the above operations, an image for the first frame can be displayed in the pixel portion 631.

Note that in one embodiment of the present invention, the scan lines G1 to Gy are not necessarily selected sequentially.

It is possible to employ dot sequential driving in which the S signals 633_S are sequentially input to the signal lines S1 to Sx from the S driver circuit 633 or line sequential driving in which the S signals 633_S are input all at once. Alternatively, a driving method in which the S signals 633_S are sequentially input to every plural signal lines S may be employed.

In addition, the method for selecting the scan lines G is not limited to progressive scan; interlaced scan may be employed for selecting the scan lines G.

In given one frame, the polarities of the S signals 633_S input to all the signal lines may be the same, or the polarities of the S signals 633_S to be input to the pixels may be inverted signal line by signal line.

<Writing Signals into Pixel Portion Divided into Plural Regions>

FIG. 8 illustrates a modification example of the structure of the display portion 630.

In the display portion 630 in FIG. 8, the plurality of pixels 631p, the plurality of scan lines G for selecting the pixels 631p row by row, and the plurality of signal lines S for supplying the S signals 633_S to the selected pixels 631p are provided in the pixel portion 631 divided into plural regions (specifically, a first region 631a, a second region 631b, and a third region 631c).

The input of the G signals 632_G to the scan lines G in each region is controlled by the corresponding G driver circuit 632. The input of the S signals 633_S to the signal lines S is controlled by the S driver circuit 633. Each of the plurality of pixels 631p is connected to at least one of the scan lines G and at least one of the signal lines S.

Such a structure allows the pixel portion 631 to be divided into separately driven regions.

For example, the following operation is possible: when information is input from a touch panel used as the input unit 500, coordinates specifying a region to which the information is to be input are obtained, and the G driver circuit 632 driving the region corresponding to the coordinates operates in the first mode and the G driver circuit 632 driving the other region operates in the second mode. Thus, it is possible to stop the operation of the G driver circuit for a region where information has not been input from the touch panel, that is, a region where rewriting of a displayed image is not necessary.

<2. Operation of G Driver Circuit in First Mode and Second Mode>

The S signal 633_S is input to the pixel circuit 634 to which the G signal 632_G output from the G driver circuit 632 is input. In a period during which the G signal 632_G is not input, the pixel circuit 634 holds the potential of the S signal 633_S. In other words, the pixel circuit 634 holds a state where the potential of the S signal 633_S is written in.

The pixel circuit 634 into which display data is written maintains a display state corresponding to the S signal 633_S. Note that to maintain a display state is to keep the amount of change in display state within a given range. This given range is set as appropriate, and is preferably set so that a user viewing displayed images can recognize the displayed images as the same image.

The G driver circuit 632 has the first mode and the second mode.

<2-1. First Mode>

The G driver circuit 632 in the first mode outputs the G signals 632_G to pixels at a rate of more than or equal to 30 times per second, preferably more than or equal to 60 times per second and less than 960 times per second.

The G driver circuit 632 in the first mode rewrites signals at a speed high enough to prevent a change in image due to signal rewrite operation from being recognized by a user. As a result, a smooth moving image can be displayed.

<2-2. Second Mode>

The G driver circuit 632 in the second mode outputs the G signals 632_G to pixels at a rate of more than or equal to once per day and less than 0.1 times per second, preferably more than or equal to once per hour and less than once per second.

In a period during which the G signal 632_G is not input, the pixel circuit 634 keeps holding the S signal 633_S and maintains the display state corresponding to the potential of the S signal 633_S.

In this manner, display without flicker due to rewriting of the display in the pixels can be performed in the second mode.

As a result, eye fatigue of the user of the information processing device having the above display function can be suppressed.

In the second mode, power consumption can be reduced as compared to the first mode. This is because the second mode has a period during which the G driver circuit 632 is not operated.

Note that the pixel circuit that is driven by the G driver circuit 632 having the second mode is preferably configured to hold the S signal 633_S for a long period. For example, the off-state leakage current of the transistor 634t is preferably as low as possible.

Embodiment 5 can be referred to for examples of a structure of the transistor 634t with low off-state leakage current.

Note that this embodiment can be combined with any of the other embodiments in this specification as appropriate.

(Embodiment 4)

In this embodiment, an information processing method of an information processing device of one embodiment of the present invention will be described with reference to FIGS. 17A and 17B.

Specifically, description is given on a method for generating an image that can be displayed on the display portion of the information processing device of one embodiment of the present invention. In particular, an eye-friendly image switching method used when an image (a first still image) is switched to the next image (a second still image following the first still image) is described. The eye-friendly image switching method includes an image switching method which causes less eye fatigue of a user and an image switching method which prevents strain from being put on the user's eyes.

Figure 17A:
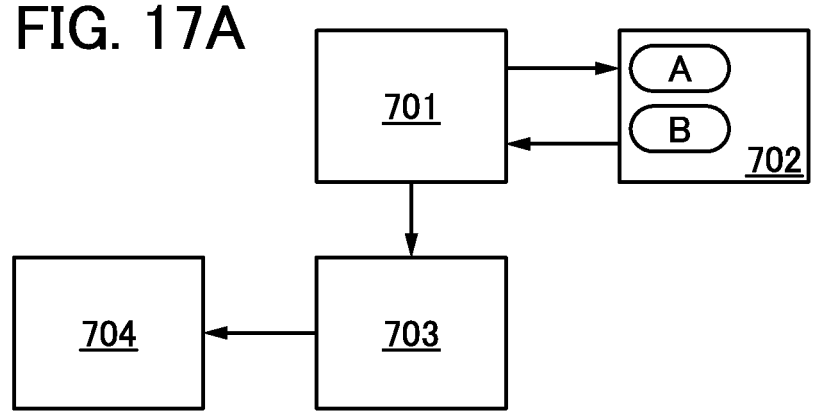
FIG. 17A is a block diagram illustrating a structure of an information processing device to which an information processing method of an embodiment can be applied.
Figure 17B:
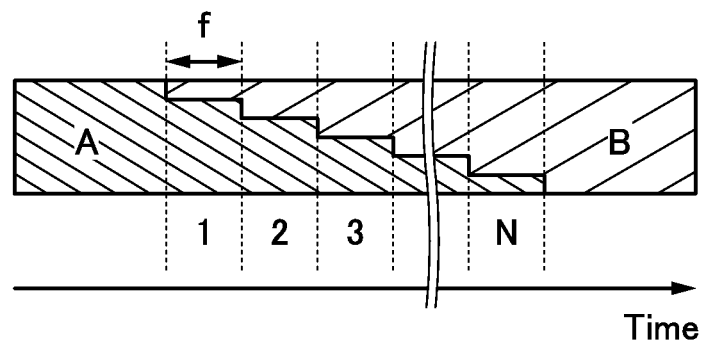
FIG. 17B is a schematic view for explaining image data.

FIG. 17A is a block diagram illustrating a structure of an information processing device to which an information processing method of one embodiment of the present invention can be applied, and FIG. 17B is a schematic view for explaining image data.

<Information Processing Method>

One embodiment of the present invention is an information processing method in which the first still image is smoothly switched to the second still image following the first still image.

In the information processing method of one embodiment of the present invention, information which is processed by an arithmetic device and cannot be displayed in one screen is divided into plural still images and the still images are sequentially displayed on a screen or a window as display images. In particular, in this embodiment, display images are smoothly switched. Thus, a user of the information processing device does not need to follow a scrolling image with one's eyes to find the target information, which leads to a reduction in strain put on the user's eyes. Moreover, strain put on the user's eyes when display images are switched is reduced. Consequently, a novel information processing method which enables eye-friendly display of an image including information processed by an arithmetic device can be provided.

A user may feel eye fatigue when display is performed by switching images rapidly, for example, when scenes switch frequently in a moving image or when a still image switches to a different still image.

When display is performed by switching an image to a different image, it is preferable to switch images gradually (smoothly) and naturally, instead of instantaneously.

For example, when the first still image is switched to the second still image, it is preferable to insert a moving image of the first still image fading out and/or a moving image of the second still image fading in between the first still image and the second still image. Alternatively, a moving image obtained by overlapping the first still image and the still second image may be inserted so that the second still image fades in at the same time when the first still image fades out (this technique is also referred to as cross-fading). Further alternatively, a moving image for displaying the process in which the first still image gradually changes into the second still image may be inserted (this technique is also referred to as morphing).

Note that a first still image may be displayed at a low refresh rate, followed by display of an image for image switching at a high refresh rate, and then a second still image may be displayed at a low refresh rate.

<Fade-in and Fade-Out>

An example of a method of switching display between an image A and an image B that are different from each other will be described below.

FIG. 17A is a block diagram illustrating a structure of a display portion capable of switching images. The display portion illustrated in FIG. 17A includes an arithmetic device 701, a memory device 702, a graphic unit 703, and a display unit 704.

In a first step, the arithmetic device 701 makes the memory device 702 store data of the image A and data of the image B from an external memory device or the like.

In a second step, the arithmetic device 701 sequentially generates new image data based on the data of the image A and the data of the image B in accordance with the predetermined number by which the image data is divided.

In a third step, the generated image data is output to the graphic unit 703. The graphic unit 703 makes the display unit 704 display the input image data.

FIG. 17B is a schematic view illustrating image data used when images are gradually switched from the image A to the image B.

For example, in switching images, N pieces of image data (N is a natural number) may be generated for image switching from the image A to the image B, and each piece of image data may be shown for f frames (f is a natural number). Specifically, when f=1, the period for the switching from the image A to the image B is f×N frames (see FIG. 17B).

It is preferable that a user can freely set the parameters such as N and f. The arithmetic device 701 obtains these parameters in advance, and generates image data in accordance with the parameters.

The i-th image data (i is an integer of greater than or equal to 1 and smaller than or equal to N) can be generated by obtaining weighted average of the image data of the image A and the image data of the image B using successively varying coefficients. For example, in a pixel, when the luminance (gray level) in the case of displaying the image A is a and the luminance (gray level) in the case of displaying the image B is b, the luminance (gray level) c in the case of displaying the i-th image data is a value in a formula (4). Note that a gray level means a level of gradation displayed on the display portion. An image with gradation of only two levels, white and black, can be referred to as an image with two gray levels. For example, a display portion of a conventional personal computer includes subpixels which display red, green, and blue. Signals for expressing gradation of 256 levels are input to the subpixels.

$$c = \frac{(N+1-i)a + ib}{N+1} \qquad (4)$$

The image A is switched to the image B using the image data generated by such a method, so that discontinuous images can be switched gradually (smoothly) and naturally.

Note that in the formula (4), in the case where a=0 in all pixels (the case where the image A is a black image), a black image is gradually switched to the image B (that is, fade-in). Further, in the case where b=0 in all pixels (the case where the image B is a black image), the image A is gradually switched to a black image (that is, fade-out).

The above describes a method for switching images by overlapping two images temporarily; however, a method in which two images are not overlapped may be employed.

In the case where two images are not overlapped with each other, a black image may be inserted while the image A is switched to the image B. In this case, the above image switching method can be used when the image A is switched to the black image and/or the black image is switched to the image B. The image inserted between the image A and the image B is not limited to a black image, and may be a single color image such as a white image or a multi-color image which is different from the image A and the image B.

When another image, particularly a single color image such as a black image, is inserted between the image A and the image B, a user can feel the timing of the switch of images more natural; thus, images can be switched without giving the user stress.

Note that this embodiment can be combined with any of the other embodiments in this specification as appropriate.

(Embodiment 5)

Examples of a semiconductor and a semiconductor film which are preferably used for a region where a channel is formed in a transistor are described below.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

A transistor which includes the semiconductor film described in this embodiment and has low off-state current can be used in the display portion of the display device described in Embodiment 1. Specifically, when the transistor is used as a switching element in the pixel circuit included in the pixel portion, a display state of a display element can be held for a long time as compared with a conventional transistor (e.g., a transistor in which amorphous silicon is used for a semiconductor film). Thus, the rate of output of G signals for selecting pixels in the display portion of the information processing device can be significantly reduced as described in Embodiment 3.

In the case where an oxide semiconductor film is used for a transistor, the thickness of the oxide semiconductor film is preferably greater than or equal to 2 nm and less than or equal to 40 nm.

An oxide semiconductor containing at least indium (In) or zinc (Zn) is preferably used. In particular, In and Zn are preferably contained. In addition, as a stabilizer for reducing variation in electrical characteristics of a transistor using the oxide semiconductor, one or more elements selected from gallium (Ga), tin (Sn), hafnium (Hf), zirconium (Zr), titanium (Ti), scandium (Sc), yttrium (Y), and a lanthanoid (such as cerium (Ce), neodymium (Nd), or gadolinium (Gd)) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. Further, the In—Ga—Zn-based oxide may contain a metal element other than In, Ga, and Zn.

Alternatively, a material represented by $InMO_3(ZnO)_m$ (m>0 is satisfied, and m is not an integer) may be used as the oxide semiconductor. Note that M represents one or more metal elements selected from Ga, Fe, Mn, and Co, or the above-described element as a stabilizer. Alternatively, as the oxide semiconductor, a material represented by $In_2SnO_5(ZnO)_n$ (n>0 is satisfied, and n is an integer) may be used.

For example, an In—Ga—Zn-based oxide with an atomic ratio of In:Ga:Zn=1:1:1, In:Ga:Zn=1:3:2, In:Ga:Zn=3:1:2, or In:Ga:Zn=2:1:3, or an oxide with an atomic ratio close to the above atomic ratios can be used.

When the oxide semiconductor film contains a large amount of hydrogen, the hydrogen and an oxide semiconductor are bonded to each other, so that part of the hydrogen serves as a donor and causes generation of an electron which is a carrier. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Accordingly, it is preferable that oxygen be added to the oxide semiconductor film to fill oxygen vacancies increased by the dehydration treatment (dehydrogenation treatment). In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density of lower than or equal to $1\times10^{17}/cm^3$, lower than or equal to $1\times10^{16}/cm^3$, lower than or equal to $1\times10^{15}/cm^3$, lower than or equal to $1\times10^{14}/cm^3$, or lower than or equal to $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off state can be less than or equal to $1\times10^{-18}$ A, preferably less than or equal to $1\times10^{-21}$ A, further preferably less than or equal to $1\times10^{-24}$ A at room temperature (about 25° C.); or less than or equal to $1\times10^{-15}$ A, preferably less than or equal to $1\times10^{-18}$ A, further preferably less than or equal to $1\times10^{-21}$ A at 85° C. An off state of a transistor refers to a state where gate voltage is sufficiently lower than the threshold voltage in an n-channel transistor. Specifically, the transistor is in an off state when the gate voltage is lower than the threshold voltage by 1V or more, 2V or more, or 3V or more.

The oxide semiconductor film may be either single crystal or non-single-crystal. In the latter case, the oxide semiconductor film may be either amorphous or polycrystalline. Further, the oxide semiconductor film may have either an amorphous structure including a crystalline portion or a non-amorphous structure.

Preferably, a CAAC-OS (c-axis aligned crystalline oxide semiconductor) film can be used as the oxide semiconductor film.

The CAAC-OS film is not completely single crystal nor completely amorphous. Note that in most cases, a crystal part included in the CAAC-OS film fits inside a cube whose one side is less than 100 nm. In an image obtained with a transmission electron microscope (TEM), a boundary between crystal parts in the CAAC-OS film is not clear. Further, with the TEM, a grain boundary in the CAAC-OS film is not clearly found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases. Further, when an impurity is added to the CAAC-OS film, crystallinity of the crystal part in a region to which the impurity is added is lowered in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

In a transistor using the CAAC-OS film, change in electrical characteristics due to irradiation with visible light or ultraviolet light is small. Thus, the transistor has high reliability.

For example, a CAAC-OS film can be deposited by a sputtering method using a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle or the pellet-like sputtered particle reaches a surface where the CAAC-OS film is to be deposited while maintaining its crystal state, whereby the CAAC-OS film can be deposited.

The flat-plate-like sputtered particle has, for example, an equivalent circle diameter of a plane parallel to the a-b plane of greater than or equal to 3 nm and less than or equal to 10 nm, and a thickness (length in the direction perpendicular to the a-b plane) of greater than or equal to 0.7 nm and less than 1 nm. Note that in the flat-plate-like sputtered particle, the plane parallel to the a-b plane may be a regular triangle or a regular hexagon. Here, the term "equivalent circle diameter of a plane" refers to the diameter of a perfect circle having the same area as the plane.

For the deposition of the CAAC-OS film, the following conditions are preferably used.

When the substrate temperature during the deposition is increased, migration of the flat-plate-like sputtered particles which have reached the substrate occurs, so that a flat plane of each sputtered particle is attached to the substrate. At this time, the sputtered particles are positively charged, thereby being attached to the substrate while repelling each other; thus, the sputtered particles are not stacked unevenly, so that a CAAC-OS film with a uniform thickness can be deposited. Specifically, the substrate temperature during the deposition is preferably higher than or equal to 100° C. and lower than or equal to 740° C., more preferably higher than or equal to 200° C. and lower than or equal to 500° C.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in a deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

After the CAAC-OS film is deposited, heat treatment may be performed. The temperature of the heat treatment is higher than or equal to 100° C. and lower than or equal to 740° C., preferably higher than or equal to 200° C. and lower than or equal to 500° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the CAAC-OS film in a short time. At the same time, the heat treatment in an inert atmosphere may generate oxygen vacancies in the CAAC-OS film. In such a case, the heat treatment in an oxidation atmosphere can reduce the oxygen vacancies. The heat treatment can further increase the crystallinity of the CAAC-OS film. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the CAAC-OS film in a shorter time.

As an example of the sputtering target, an In—Ga—Zn—O compound target is described below.

The In—Ga—Zn—O compound target, which is polycrystalline, is made by mixing $InO_X$ powder, $GaO_Y$ powder, and $ZnO_Z$ powder in a predetermined molar ratio, applying pressure, and performing heat treatment at a temperature higher than or equal to 1000° C. and lower than or equal to 1500° C. Note that X, Y, and Z are each a given positive number. Here, the predetermined molar ratio of $InO_X$ powder to $GaO_Y$ powder and $ZnO_Z$ powder is, for example, 1:1:1, 1:1:2, 1:3:2, 1:9:6, 2:1:3, 2:2:1, 3:1:1, 3:1:2, 3:1:4, 4:2:3, 8:4:3, or a ratio close to these ratios. The kinds of powder and the molar ratio for mixing powder may be determined as appropriate depending on the desired sputtering target.

Alternatively, the CAAC-OS film may be formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500°

C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film in a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film in a shorter time.

The first oxide semiconductor film with a thickness of greater than or equal to 1 nm and less than 10 nm can be easily crystallized by heat treatment as compared to the case where the first oxide semiconductor film has a thickness of greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film from the first CAAC-OS film occurs, whereby the second oxide semiconductor film is turned into a second CAAC-OS film having high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film in a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film in a shorter time.

In the above-described manner, a CAAC-OS film having a total thickness of 10 nm or more can be formed.

Further, the oxide semiconductor film may have a structure in which a plurality of oxide semiconductor films is stacked.

For example, a structure may be employed in which, between an oxide semiconductor film (referred to as a first layer for convenience) and a gate insulating film, a second layer which is formed using the constituent element of the first layer and whose electron affinity is lower than that of the first layer by 0.2 eV or more is provided. In this case, when an electric field is applied from a gate electrode, a channel is formed in the first layer, and a channel is not formed in the second layer. The constituent element of the first layer is the same as the constituent element of the second layer, and thus interface scattering hardly occurs at the interface between the first layer and the second layer. Accordingly, when the second layer is provided between the first layer and the gate insulating film, the field-effect mobility of the transistor can be increased.

Further, in the case where a silicon oxide film, a silicon oxynitride film, a silicon nitride oxide film, or a silicon nitride film is used as the gate insulating film, silicon contained in the gate insulating film enters the oxide semiconductor film in some cases. When the oxide semiconductor film contains silicon, reductions in crystallinity and carrier mobility of the oxide semiconductor film occur, for example. Thus, it is preferable to provide the second layer between the first layer and the gate insulating film in order to reduce the concentration of silicon in the first layer where a channel is formed. For the same reason, it is preferable to provide a third layer which is formed using the constituent element of the first layer and whose electron affinity is lower than that of the first layer by 0.2 eV or more so that the first layer is interposed between the second layer and the third layer.

Such a structure makes it possible to reduce and further prevent diffusion of impurities such as silicon to a region where a channel is formed, so that a highly reliable transistor can be obtained.

Note that in order to make the oxide semiconductor film a CAAC-OS film, the concentration of silicon contained in the oxide semiconductor film is set to lower than or equal to $2.5 \times 10^{21}/cm^3$, preferably lower than $1.4 \times 10^{21}/cm^3$, more preferably lower than $4 \times 10^{19}/cm^3$, still more preferably lower than $2.0 \times 10^{18}/cm^3$. This is because the field-effect mobility of the transistor may be reduced when the concentration of silicon contained in the oxide semiconductor film is higher than or equal to $1.4 \times 10^{21}/cm^3$, and the oxide semiconductor film may be made amorphous at the interface between the oxide semiconductor film and a film in contact with the oxide semiconductor film when the concentration of silicon contained in the oxide semiconductor film is higher than or equal to $4.0 \times 10^{19}/cm^3$. Further, when the concentration of silicon contained in the oxide semiconductor film is lower than $2.0 \times 10^{18}/cm^3$, further improvement in reliability of the transistor and a reduction in density of states (DOS) in the oxide semiconductor film can be expected. Note that the concentration of silicon in the oxide semiconductor film can be measured by secondary ion mass spectrometry (SIMS).

Note that this embodiment can be combined with any of the other embodiments in this specification as appropriate.

(Embodiment 6

In this embodiment, structural examples of a transistor to which the oxide semiconductor film described in Embodiment 5 is applied will be described with reference to drawings.

Figure 10A:
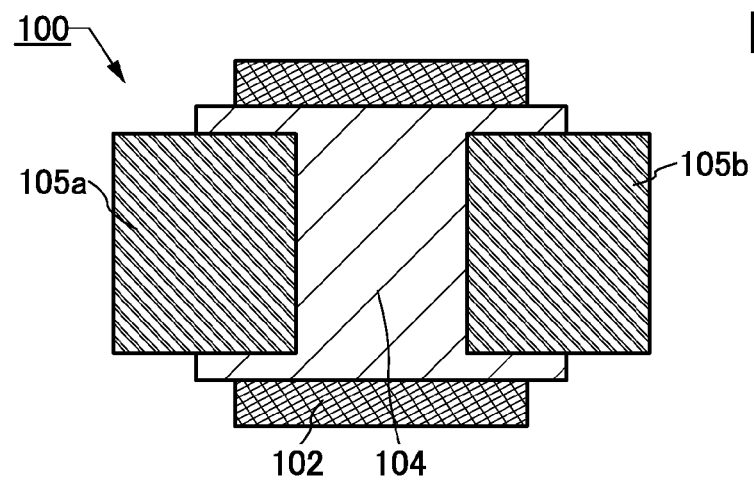
FIGS. 10A and 10B illustrate a structural example of a transistor of an embodiment.
Figure 10B:
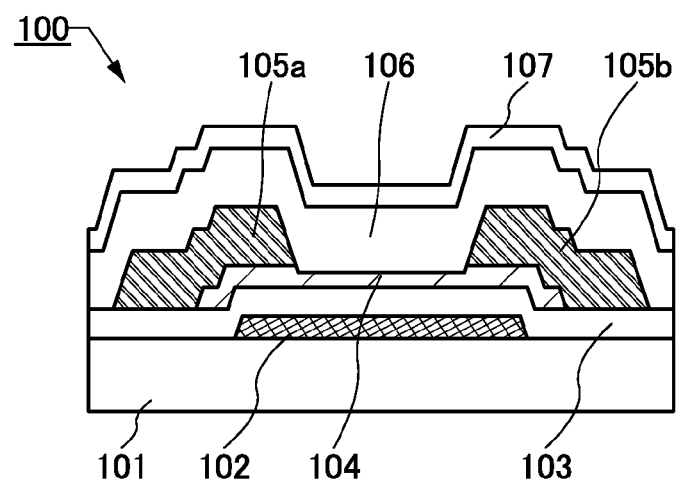

FIGS. 10A and 10B illustrate a structural example of a transistor of this embodiment.

FIGS. 11A to 11D illustrate an example of a method for manufacturing a transistor of this embodiment.

Figure 12A:
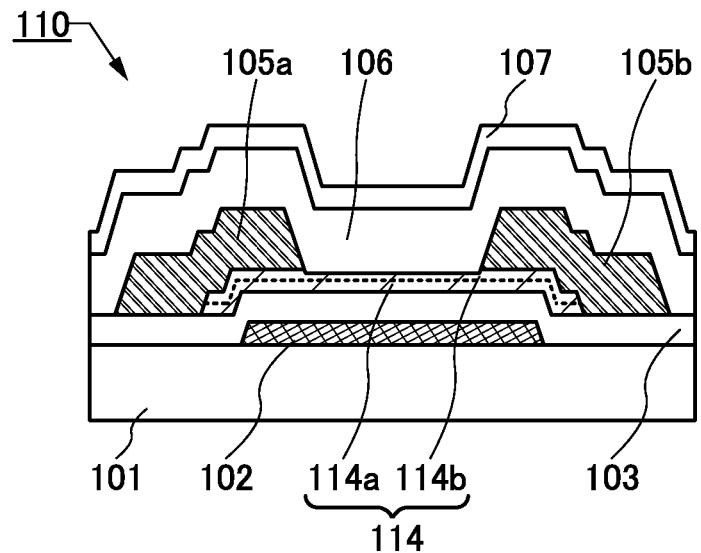
FIGS. 12A and 12B each illustrate a structural example of a transistor of an embodiment.
Figure 12B:
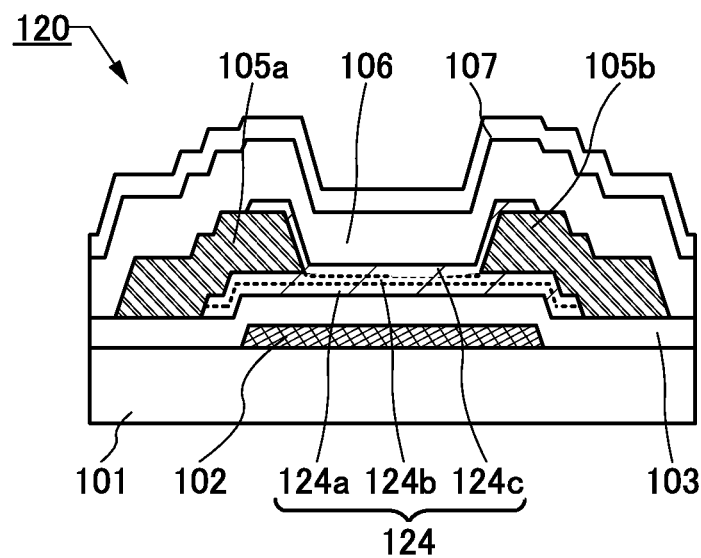

FIGS. 12A and 12B each illustrate a structural example of a transistor of this embodiment.

Figure 13A:
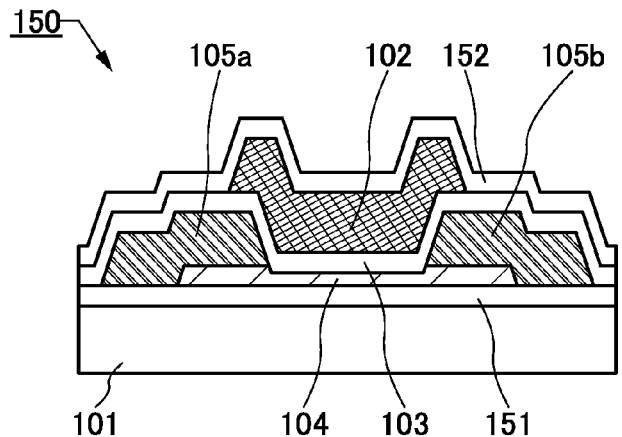
FIGS. 13A to 13C each illustrate a structural example of a transistor of an embodiment.
Figure 13B:
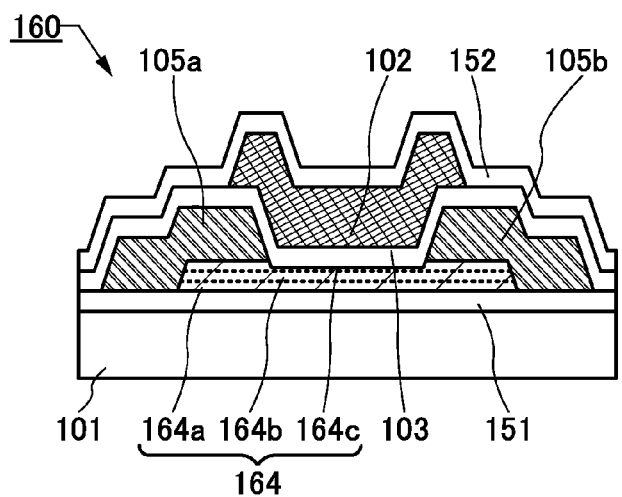
Figure 13C:
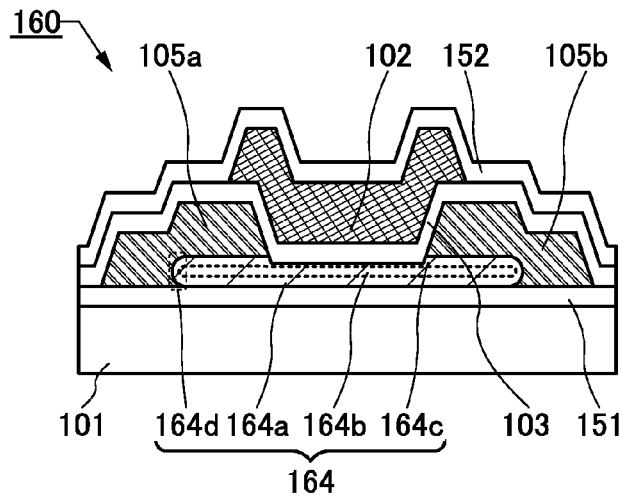

FIGS. 13A to 13C each illustrate a structural example of a transistor of this embodiment.

<Structural Example of Transistor>

FIG. 10A is a schematic top view of a transistor 100 described below as an example. FIG. 10B is a schematic cross-sectional view of the transistor 100 taken along the section line A-B in FIG. 10A. The transistor 100 described as an example in this structural example is a bottom-gate transistor.

The transistor 100 includes a gate electrode 102 over a substrate 101, an insulating layer 103 over the substrate 101 and the gate electrode 102, an oxide semiconductor layer 104 provided over the insulating layer 103 to overlap with the gate electrode 102, and a pair of electrodes 105a and 105b in contact with the top surface of the oxide semiconductor layer 104. Further, an insulating layer 106 is provided to cover the insulating layer 103, the oxide semiconductor layer 104, and the pair of electrodes 105a and 105b, and an insulating layer 107 is provided over the insulating layer 106.

The oxide semiconductor film described in Embodiment 5 can be applied to the oxide semiconductor layer 104 in the transistor 100.

<<Substrate 101>>

There is no particular limitation on the property of a material and the like of the substrate 101 as long as the material has heat resistance enough to withstand at least heat treatment which will be performed later. For example, a glass substrate, a ceramic substrate, a quartz substrate, a sapphire substrate, or an yttria-stabilized zirconia (YSZ) substrate may be used as the substrate 101. Alternatively, a single crystal semiconductor substrate or a polycrystalline semiconductor substrate made of silicon, silicon carbide, or the like, a compound semiconductor substrate made of silicon germanium or the like, an SOI substrate, or the like can be used as the substrate 101. Still alternatively, any of these substrates provided with a semiconductor element may be used as the substrate 101.

Still alternatively, a flexible substrate such as a plastic substrate may be used as the substrate 101, and the transistor 100 may be provided directly on the flexible substrate. Further alternatively, a separation layer may be provided between the substrate 101 and the transistor 100. The separation layer can be used when part or the whole of the transistor formed over the separation layer is formed and separated from the substrate 101 and transferred to another substrate. Thus, the transistor 100 can be transferred to a substrate having low heat resistance or a flexible substrate.

<<Gate Electrode 102>>

The gate electrode 102 can be formed using a metal selected from aluminum, chromium, copper, tantalum, titanium, molybdenum, and tungsten; an alloy containing any of these metals as a component; an alloy containing any of these metals in combination; or the like. Further, one or more metals selected from manganese and zirconium may be used. Furthermore, the gate electrode 102 may have a single-layer structure or a stacked-layer structure of two or more layers. For example, a single-layer structure of an aluminum film containing silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film containing aluminum and one or more metals selected from titanium, tantalum, tungsten, molybdenum, chromium, neodymium, and scandium; or a nitride film of the alloy film may be used.

The gate electrode 102 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal.

Further, an In—Ga—Zn-based oxynitride semiconductor film, an In—Sn-based oxynitride semiconductor film, an In—Ga-based oxynitride semiconductor film, an In—Zn-based oxynitride semiconductor film, a Sn-based oxynitride semiconductor film, an In-based oxynitride semiconductor film, a film of metal nitride (such as InN or ZnN), or the like may be provided between the gate electrode 102 and the insulating layer 103. These films each have a work function higher than or equal to 5 eV, preferably higher than or equal to 5.5 eV, which is higher than the electron affinity of the oxide semiconductor. Thus, the threshold voltage of the transistor including an oxide semiconductor can be shifted in the positive direction, and what is called a normally-off switching element can be achieved. For example, in the case of using an In—Ga—Zn-based oxynitride semiconductor film, an In—Ga—Zn-based oxynitride semiconductor film having a higher nitrogen concentration than at least the oxide semiconductor layer 104, specifically, an In—Ga—Zn-based oxynitride semiconductor film having a nitrogen concentration of 7 at. % or higher is used.

<<Insulating Layer 103>>

The insulating layer 103 functions as a gate insulating film. The insulating layer 103 in contact with the bottom surface of the oxide semiconductor layer 104 is preferably an amorphous film.

The insulating layer 103 may be formed to have a single-layer structure or a stacked-layer structure using, for example, one or more of silicon oxide, silicon oxynitride, silicon nitride oxide, silicon nitride, aluminum oxide, hafnium oxide, gallium oxide, Ga—Zn-based metal oxide, silicon nitride, and the like.

The insulating layer 103 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

<<Pair of Electrodes 105a and 105b>>

The pair of electrodes 105a and 105b functions as a source electrode and a drain electrode of the transistor.

The pair of electrodes 105a and 105b can be formed to have a single-layer structure or a stacked-layer structure using, as a conductive material, any of metals such as aluminum, titanium, chromium, nickel, copper, yttrium, zirconium, molybdenum, silver, tantalum, and tungsten, or an alloy containing any of these metals as its main component. For example, a single-layer structure of an aluminum film containing silicon, a two-layer structure in which a titanium film is stacked over an aluminum film, a two-layer structure in which a titanium film is stacked over a tungsten film, a two-layer structure in which a copper film is stacked over a copper-magnesium-aluminum alloy film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

<<Insulating Layer 106, 107>>

The insulating layer 106 is preferably formed using an oxide insulating film containing oxygen at a higher proportion than oxygen in the stoichiometric composition. Part of oxygen is released by heating from the oxide insulating film containing oxygen at a higher proportion than oxygen in the stoichiometric composition. The oxide insulating film containing oxygen at a higher proportion than oxygen in the stoichiometric composition is an oxide insulating film in which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in thermal desorption spectroscopy (TDS) analysis.

As the insulating layer 106, a silicon oxide film, a silicon oxynitride film, or the like can be formed.

Note that the insulating layer 106 also functions as a film which relieves damage to the oxide semiconductor layer 104 at the time of forming the insulating layer 107 later.

Alternatively, an oxide film transmitting oxygen may be provided between the insulating layer 106 and the oxide semiconductor layer 104.

As the oxide film transmitting oxygen, a silicon oxide film, a silicon oxynitride film, or the like can be formed. Note that in this specification, a "silicon oxynitride film" refers to a film that contains oxygen at a higher proportion than nitrogen, and a "silicon nitride oxide film" refers to a film that contains nitrogen at a higher proportion than oxygen.

The insulating layer 107 can be formed using an insulating film having a blocking effect against oxygen, hydrogen, water, and the like. It is possible to prevent outward diffusion of oxygen from the oxide semiconductor layer 104 and entry of hydrogen, water, or the like into the oxide semiconductor layer 104 from the outside by providing the insulating layer 107 over the insulating layer 106. As for the insulating film having a blocking effect against oxygen, hydrogen, water, and the like, a silicon nitride film, a silicon nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given as examples.

<Example of Manufacturing Method of Transistor>

Next, an example of a manufacturing method of the transistor 100 illustrated in FIGS. 10A and 10B will be described.

Figure 11A:
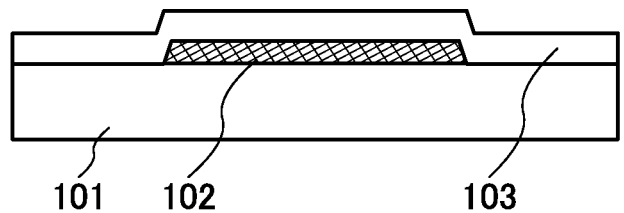
FIGS. 11A to 11D illustrate an example of a method for manufacturing a transistor of an embodiment.

First, as illustrated in FIG. 11A, the gate electrode 102 is formed over the substrate 101, and the insulating layer 103 is formed over the gate electrode 102.

Here, a glass substrate is used as the substrate 101.

<<Formation of Gate Electrode>>

A formation method of the gate electrode 102 is described below. First, a conductive film is formed by a sputtering method, a CVD method, an evaporation method, or the like and then a resist mask is formed over the conductive film using a first photomask by a photolithography process. Then, part of the conductive film is etched using the resist mask to form the gate electrode 102. After that, the resist mask is removed.

Note that instead of the above formation method, the gate electrode 102 may be formed by an electrolytic plating method, a printing method, an ink-jet method, or the like.

<<Formation of Gate Insulating Layer>>

The insulating layer 103 is formed by a sputtering method, a CVD method, an evaporation method, or the like.

In the case where the insulating layer 103 is formed using a silicon oxide film, a silicon oxynitride film, or a silicon nitride oxide film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

In the case of forming a silicon nitride film as the insulating layer 103, it is preferable to use a two-step formation method. First, a first silicon nitride film with a small number of defects is formed by a plasma CVD method in which a mixed gas of silane, nitrogen, and ammonia is used as a source gas. Then, a second silicon nitride film which has low hydrogen concentration and can block hydrogen is formed by switching the source gas to a mixed gas of silane and nitrogen. With such a formation method, a silicon nitride film with a small number of defects and a blocking property against hydrogen can be formed as the insulating layer 103.

Moreover, in the case of forming a gallium oxide film as the insulating layer 103, a metal organic chemical vapor deposition (MOCVD) method can be employed.

<<Formation of Oxide Semiconductor Layer>>

Figure 11B:
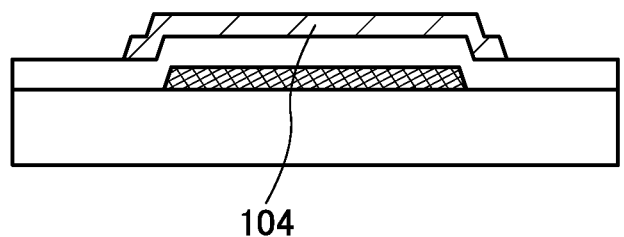

Next, as illustrated in FIG. 11B, the oxide semiconductor layer 104 is formed over the insulating layer 103.

A formation method of the oxide semiconductor layer 104 is described below.

First, an oxide semiconductor film is formed using the method described in Embodiment 5. Then, a resist mask is formed over the oxide semiconductor film using a second photomask by a photolithography process. Then, part of the oxide semiconductor film is etched using the resist mask to form the oxide semiconductor layer 104. After that, the resist mask is removed.

After that, heat treatment may be performed. In such a case, the heat treatment is preferably performed under an atmosphere containing oxygen.

Although the oxide semiconductor layer described in the above embodiment can be formed by a sputtering method, such a layer may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and the source gas and the oxidizer react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetitions times of the sequence of the gas introduction; therefore, an ALD method makes it possible to accurately adjust a thickness and thus is suitable for manufacturing a minute FET.

For example, in the case where an In—Ga—Zn—O film is formed using a deposition apparatus employing MOCVD, trimethylindium, trimethylgallium, and dimethylzinc are used. Note that the chemical formula of trimethylindium is $In(CH_3)_3$.

The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where an oxide semiconductor layer, e.g., an In—Ga—Zn—O film is formed using a deposition apparatus employing ALD, an $In(CH_3)_3$ gas and an $O_3$ gas are sequentially introduced plural times to form an $InO_2$ layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Further, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<<Formation of Pair of Electrodes>>

Figure 11C:
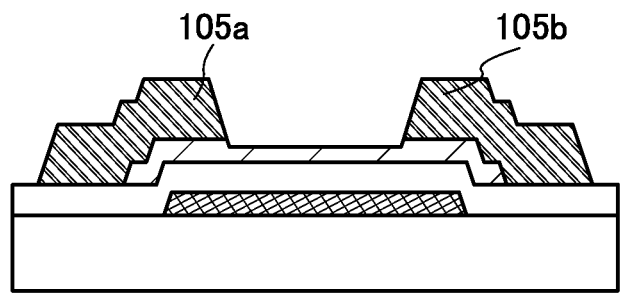

Next, as illustrated in FIG. 11C, the pair of electrodes 105a and 105b is formed.

A formation method of the pair of electrodes 105a and 105b is described below. First, a conductive film is formed by a sputtering method, a CVD method, an evaporation method, or the like. Then, a resist mask is formed over the conductive film using a third photomask by a photolithography process. Then, part of the conductive film is etched using the resist mask to form the pair of electrodes 105a and 105b. After that, the resist mask is removed.

Note that as illustrated in FIG. 11B, an upper part of the oxide semiconductor layer 104 is in some cases partly etched and thinned by the etching of the conductive film. For this reason, the oxide semiconductor layer 104 is preferably formed thick.

<<Formation of Insulating Layer>>

Figure 11D:
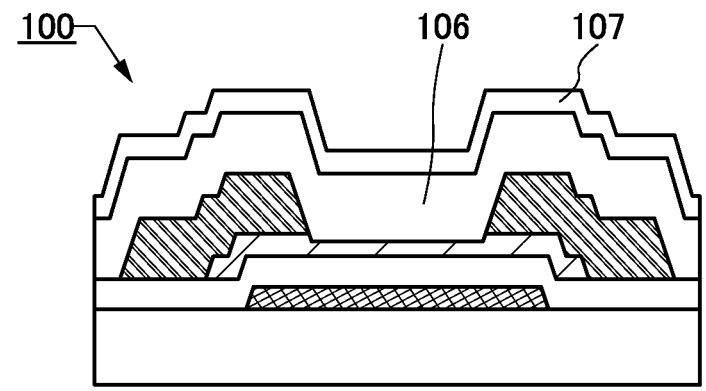

Next, as illustrated in FIG. 11D, the insulating layer 106 is formed over the oxide semiconductor layer 104 and the pair of electrodes 105a and 105b, and the insulating layer 107 is successively formed over the insulating layer 106.

In the case where the insulating layer 106 is formed using a silicon oxide film or a silicon oxynitride film, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

For example, a silicon oxide film or a silicon oxynitride film is formed under the conditions as follows: the substrate placed in a treatment chamber of a plasma CVD apparatus, which is vacuum-evacuated, is held at a temperature higher than or equal to 180° C. and lower than or equal to 260° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa with introduction of a source gas into the treatment chamber, and high-frequency power higher than or equal to 0.17 $W/cm^2$ and lower than or equal to 0.5 $W/cm^2$, preferably higher than or equal to 0.25 $W/cm^2$ and lower than or equal to 0.35 $W/cm^2$ is supplied to an electrode provided in the treatment chamber.

As the film formation conditions, the high-frequency power having the above power density is supplied to the treatment chamber having the above pressure, whereby the decomposition efficiency of the source gas in plasma is increased, oxygen radicals are increased, and oxidation of the source gas is promoted; therefore, oxygen is contained in the oxide insulating film at a higher proportion than oxygen in the stoichiometric composition. However, in the case where the substrate temperature is within the above temperature range, the bond between silicon and oxygen is weak, and accordingly, part of oxygen is released by heating. Thus, it is possible to form an oxide insulating film which contains oxygen at a higher proportion than oxygen in the stoichiometric composition and from which part of oxygen is released by heating.

Further, in the case of providing an oxide insulating film between the oxide semiconductor layer 104 and the insulating layer 106, the oxide insulating film serves as a protective film for the oxide semiconductor layer 104 in the steps of forming the insulating layer 106. Thus, the insulating layer 106 can be formed using the high-frequency power having a high power density while damage to the oxide semiconductor layer 104 is reduced.

For example, a silicon oxide film or a silicon oxynitride film is formed as the oxide insulating film under the conditions as follows: the substrate placed in a treatment chamber of a plasma CVD apparatus, which is vacuum-evacuated, is held at a temperature higher than or equal to 180° C. and lower than or equal to 400° C., preferably higher than or equal to 200° C. and lower than or equal to 370° C., the pressure is greater than or equal to 20 Pa and less than or equal to 250 Pa, preferably greater than or equal to 100 Pa and less than or equal to 250 Pa with introduction of a source gas into the treatment chamber, and high-frequency power is supplied to an electrode provided in the treatment chamber. When the pressure in the treatment chamber is greater than or equal to 100 Pa and less than or equal to 250 Pa, damage to the oxide semiconductor layer 104 at the time of forming the oxide insulating film can be reduced.

A deposition gas containing silicon and an oxidizing gas are preferably used as a source gas of the oxide insulating film. Typical examples of the deposition gas containing silicon include silane, disilane, trisilane, and silane fluoride. As the oxidizing gas, oxygen, ozone, dinitrogen monoxide, and nitrogen dioxide can be given as examples.

The insulating layer 107 can be formed by a sputtering method, a CVD method, or the like.

In the case where the insulating layer 107 is formed using a silicon nitride film or a silicon nitride oxide film, a deposition gas containing silicon, an oxidizing gas, and a gas containing nitrogen are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples. As the gas containing nitrogen, nitrogen and ammonia can be given as examples.

Through the above process, the transistor 100 can be formed.

<Modification Example of Transistor 100>

A structural example of a transistor, which is partly different from the transistor 100, will be described below.

(Modification Example 1)

FIG. 12A is a schematic cross-sectional view of a transistor 110 described as an example below. The transistor 110 differs from the transistor 100 in the structure of an oxide semiconductor layer.

In an oxide semiconductor layer 114 included in the transistor 110, an oxide semiconductor layer 114a and an oxide semiconductor layer 114b are stacked.

Since a boundary between the oxide semiconductor layer 114a and the oxide semiconductor layer 114b is unclear in some cases, the boundary is shown by a dashed line in FIG. 12A and the like.

The oxide semiconductor film of one embodiment of the present invention can be applied to one or both of the oxide semiconductor layers 114a and 114b.

Typical examples of a material that can be used for the oxide semiconductor layer 114a are an In—Ga-based oxide, an In—Zn-based oxide, and an In—M-Zn-based oxide (M is Al, Ti, Ga, Y, Zr, La, Ce, Nd, or Hf). When an In—M-Zn-based oxide is used for the oxide semiconductor layer 114a, the atomic ratio between In and M is preferably as follows: the atomic percentage of In is less than 50 at. % and the atomic percentage of M is greater than or equal to 50 at. %; further preferably, the atomic percentage of In is less than 25 at. % and the atomic percentage of M is greater than or equal to 75 at. %. Further, a material having an energy gap of 2 eV or more, preferably 2.5 eV or more, further preferably 3 eV or more is used for the oxide semiconductor layer 114a, for example.

For example, the oxide semiconductor layer 114b contains In or Ga; the oxide semiconductor layer 114b contains, for example, a material typified by an In—Ga-based oxide, an In—Zn-based oxide, or an In—M-Zn-based oxide (M is Al, Ti, Ga, Y, Zr, La, Ce, Nd, or Hp. In addition, the energy of the conduction band minimum of the oxide semiconductor layer 114b is closer to the vacuum level than is that of the oxide semiconductor layer 114a. The difference between the energy of the conduction band minimum of the oxide semiconductor layer 114b and the energy of the conduction band minimum of the oxide semiconductor layer 114a is preferably 0.05 eV or more, 0.07 eV or more, 0.1 eV or more, or 0.15 eV or more and 2 eV or less, 1 eV or less, 0.5 eV or less, or 0.4 eV or less.

When an In—M-Zn-based oxide is used for the oxide semiconductor layer 114b, for example, the atomic ratio between In and M is preferably as follows: the atomic percentage of In is greater than or equal to 25 at. % and the atomic percentage of M is less than 75 at. %; further preferably, the atomic percentage of In is greater than or equal to 34 at. % and the atomic percentage of M is less than 66 at. %.

For the oxide semiconductor layer 114a, an In—Ga—Zn-based oxide containing In, Ga, and Zn at an atomic ratio of 1:1:1 or 3:1:2 can be used, for example. Further, for the oxide semiconductor layer 114b, an In—Ga—Zn-based oxide containing In, Ga, and Zn at an atomic ratio of 1:3:2, 1:6:4, or 1:9:6 can be used. Note that the atomic ratio of each of the oxide semiconductor layers 114a and 114b may vary within a margin of ±20% of the corresponding atomic ratio.

When an oxide containing a large amount of Ga that serves as a stabilizer is used for the oxide semiconductor layer 114b provided over the oxide semiconductor layer 114a, oxygen can be prevented from being released from the oxide semiconductor layers 114a and 114b.

Note that, without limitation to those described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor layers 114a and 114b be set to be appropriate.

Although a structure in which two oxide semiconductor layers are stacked is described above as an example of the oxide semiconductor layer 114, a structure in which three or more oxide semiconductor layers are stacked can also be employed.

<<Modification Example 2>>

FIG. 12B is a schematic cross-sectional view of a transistor 120 described as an example below. The transistor 120 differs from the transistor 100 and the transistor 110 in the structure of an oxide semiconductor layer.

In an oxide semiconductor layer 124 included in the transistor 120, an oxide semiconductor layer 124a, an oxide semiconductor layer 124b, and an oxide semiconductor layer 124c are stacked in this order.

The oxide semiconductor layers 124a and 124b are stacked over the insulating layer 103. The oxide semiconductor layer 124c is provided in contact with the top surface of the oxide semiconductor layer 124b and the top surfaces and side surfaces of the pair of electrodes 105a and 105b.

The oxide semiconductor film described in Embodiment 5 can be applied to one or more of the oxide semiconductor layers 124a, 124b, and 124c.

The oxide semiconductor layer 124b can have a structure which is similar to that of the oxide semiconductor layer 114a described as an example in Modification Example 1, for example. Further, the oxide semiconductor layers 124a and 124c can each have a structure which is similar to that of the oxide semiconductor layer 114b described as an example in Modification Example 1, for example.

When an oxide containing a large amount of Ga that serves as a stabilizer is used for the oxide semiconductor layer 124a, which is provided under the oxide semiconductor layer 124b, and the oxide semiconductor layer 124c, which is provided over the oxide semiconductor layer 124b, for example, oxygen can be prevented from being released from the oxide semiconductor layer 124a, the oxide semiconductor layer 124b, and the oxide semiconductor layer 124c.

In the case where a channel is mainly formed in the oxide semiconductor layer 124b, for example, an oxide containing a large amount of In can be used for the oxide semiconductor layer 124b and the pair of electrodes 105a and 105b is provided in contact with the oxide semiconductor layer 124*b*; thus, the on-state current of the transistor 120 can be increased.

<Another Structural Example of Transistor>

A structural example of a top-gate transistor to which the oxide semiconductor film of one embodiment of the present invention can be applied will be described below.

Note that descriptions of components having structures or functions similar to those of the above, which are denoted by the same reference numerals, are omitted below.

<<Structural Example>>

FIG. 13A is a schematic cross-sectional view of a top-gate transistor 150 which will be described below as an example.

The transistor 150 includes the oxide semiconductor layer 104 over the substrate 101 on which an insulating layer 151 is provided, the pair of electrodes 105*a* and 105*b* in contact with the top surface of the oxide semiconductor layer 104, the insulating layer 103 over the oxide semiconductor layer 104 and the pair of electrodes 105*a* and 105*b*, and the gate electrode 102 provided over the insulating layer 103 so as to overlap with the oxide semiconductor layer 104. Further, an insulating layer 152 is provided to cover the insulating layer 103 and the gate electrode 102.

The oxide semiconductor film described in Embodiment 5 can be applied to the oxide semiconductor layer 104 in the transistor 150.

The insulating layer 151 has a function of suppressing diffusion of impurities from the substrate 101 into the oxide semiconductor layer 104. For example, a structure similar to that of the insulating layer 107 can be employed. Note that the insulating layer 151 is not necessarily provided.

Like the insulating layer 107, the insulating layer 152 can be formed using an insulating film having a blocking effect against oxygen, hydrogen, water, and the like.

Note that the insulating layer 152 is not necessarily provided.

<<Modification Example>>

A structural example of a transistor, which is partly different from the transistor 150, will be described below.

FIG. 13B is a schematic cross-sectional view of a transistor 160 described as an example below. The structure of an oxide semiconductor layer in the transistor 160 is different from that in the transistor 150.

In an oxide semiconductor layer 164 included in the transistor 160, an oxide semiconductor layer 164*a*, an oxide semiconductor layer 164*b*, and an oxide semiconductor layer 164*c* are stacked in this order.

The oxide semiconductor film of one embodiment of the present invention can be applied to one or more of the oxide semiconductor layer 164*a*, the oxide semiconductor layer 164*b*, and the oxide semiconductor layer 164*c*.

The oxide semiconductor layer 164*b* can have a structure which is similar to that of the oxide semiconductor layer 114*a* described as an example in Modification Example 1, for example. Further, the oxide semiconductor layers 164*a* and 164*c* can each have a structure which is similar to that of the oxide semiconductor layer 114*b* described as an example in Modification Example 1, for example.

An oxide containing a large amount of Ga that serves as a stabilizer is used for the oxide semiconductor layer 164*a*, which is provided under the oxide semiconductor layer 164*b*, and the oxide semiconductor layer 164*c*, which is provided over the oxide semiconductor layer 164*b*, for example; thus, oxygen can be prevented from being released from the oxide semiconductor layer 164*a*, the oxide semiconductor layer 164*b*, and the oxide semiconductor layer 164*c*.

The oxide semiconductor layer 164 can be formed in the following manner: the oxide semiconductor layer 164*c* and the oxide semiconductor layer 164*b* are obtained by etching, so that an oxide semiconductor film to be the oxide semiconductor layer 164*a* is exposed; and the oxide semiconductor film is processed into the oxide semiconductor layer 164*a* by a dry etching method. In that case, a reaction product of the oxide semiconductor film is attached to side surfaces of the oxide semiconductor layers 164*b* and 164*c* to form a sidewall protective layer (also referred to as a rabbit ear) in some cases. Note that the reaction product is attached owing to a sputtering phenomenon or plasma at the dry etching.

FIG. 13C is a schematic cross-sectional view of the transistor 160 in which a sidewall protective layer 164*d* is formed as a side surface of the oxide semiconductor layer 164 in the above manner.

The sidewall protective layer 164*d* mainly contains the same material as the oxide semiconductor layer 164*a*. In some cases, the sidewall protective layer 164*d* contains the constituent (e.g., silicon) of a layer provided under the oxide semiconductor layer 164*a* (the insulating layer 151 here).

With a structure in which a side surface of the oxide semiconductor layer 164*b* is covered with the sidewall protective layer 164*d* so as not to be in contact with the pair of electrodes 105*a* and 105*b* as illustrated in FIG. 13C, unintended leakage current of the transistor in an off state can be reduced particularly when a channel is mainly formed in the oxide semiconductor layer 164*b*; thus, a transistor having favorable off-state characteristics can be fabricated. Further, when a material containing a large amount of Ga that serves as a stabilizer is used for the sidewall protective layer 164*d*, oxygen can be effectively prevented from being released from the side surface of the oxide semiconductor layer 164*b*; thus, a transistor with stable electrical characteristics can be fabricated.

This embodiment can be implemented in an appropriate combination with any of the other embodiments described in this specification.

(Embodiment 7)

In this embodiment, a structure of a touch panel in which a touch sensor (a contact detection device) as an input unit is provided to overlap with a display portion is described with reference to FIGS. 14A and 14B and FIG. 15. In the description below, description of portions similar to those in the above embodiments is omitted in some cases.

Figure 14A:
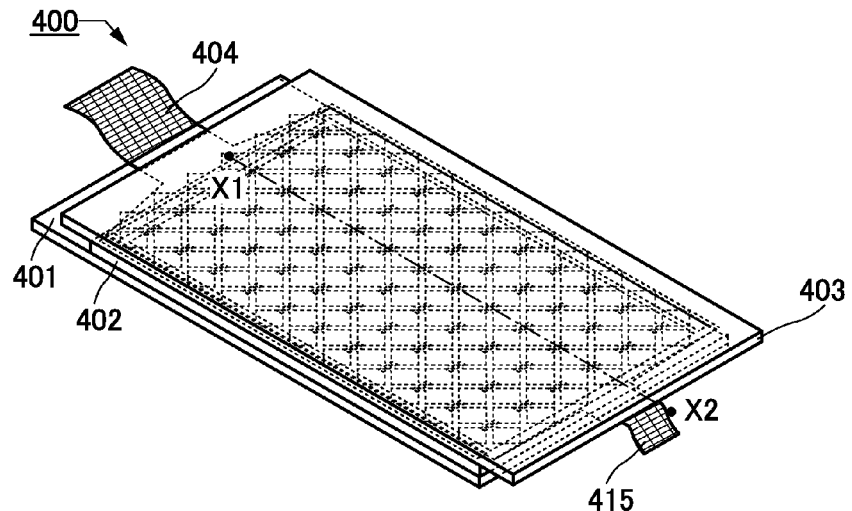
FIGS. 14A and 14B are schematic perspective views of a touch panel of an embodiment.

FIG. 14A is a schematic perspective view of a touch panel 400 described in this embodiment as an example. Note that FIGS. 14A and 14B illustrate only main components for simplicity. FIG. 14B is a developed view of the schematic perspective view of the touch panel 400.

FIG. 15 is a cross-sectional view of the touch panel 400 taken along X1-X2 in FIG. 14A.

The touch panel 400 includes a display portion 411 interposed between a first substrate 401 and a second substrate 402 and a touch sensor 430 interposed between the second substrate 402 and a third substrate 403.

The first substrate 401 is provided with the display portion 411 and a plurality of wirings 406 electrically connected to the display portion 411. The plurality of wirings 406 are led to the outer edge portion of the first substrate 401, and part of the wirings 406 forms part of an external connection electrode 405. The external connection electrode 405 is electrically connected to an FPC 404.

<Touch Sensor>

The third substrate 403 is provided with the touch sensor 430 and a plurality of wirings 417 electrically connected to the touch sensor 430. The touch sensor 430 is provided on a surface of the third substrate 403 facing the second substrate

402. The plurality of wirings 417 are led to the outer edge portion of the third substrate 403, and part of the wirings 417 forms part of an external connection electrode 416 electrically connected to an FPC 415. Note that in FIG. 14B, electrodes, wirings, and the like of the touch sensor 430 which are provided on the back side of the third substrate 403 (the back side of the diagram) are indicated by solid lines for clarity.

In this embodiment, a projected capacitive touch sensor is used. However, one embodiment of the present invention is not limited thereto. It is also possible to use a sensor which senses proximity or touch of an object, such as a finger, on the side opposite to the side provided with display elements.

As a touch sensor, a capacitive touch sensor is preferably used. Examples of a projected capacitive touch sensor are a self capacitive touch sensor and a mutual capacitive touch sensor, which differ mainly in the driving method. The use of a mutual capacitive touch sensor is preferable because multiple points can be sensed simultaneously.

The case of using a projected capacitive touch sensor is described below.

Figure 14B:
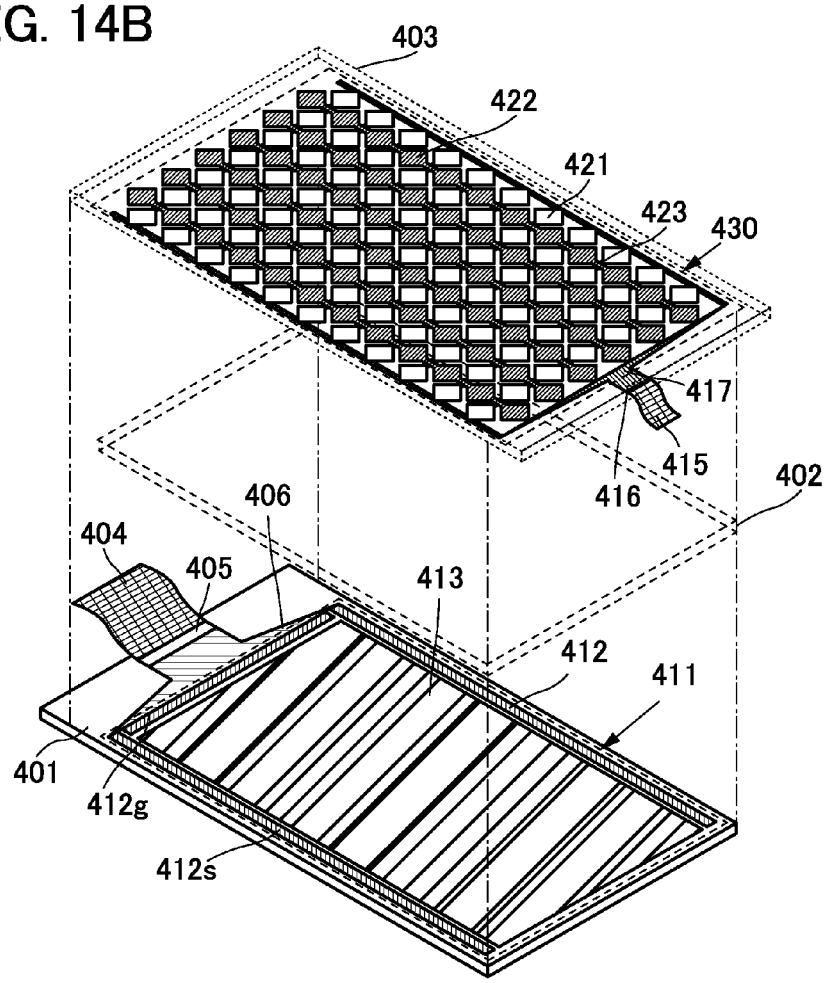

The touch sensor 430 illustrated in FIG. 14B is an example of a projected capacitive touch sensor. The touch sensor 430 includes an electrode 421 and an electrode 422. Each of the electrodes 421 and 422 is electrically connected to any one of the plurality of wirings 417.

Here, the electrode 422 is in the form of a series of quadrangles arranged in one direction as illustrated in FIGS. 14A and 14B. Each of the electrodes 421 is in the form of a quadrangle. The plurality of electrodes 421 arranged in a line in a direction intersecting with the direction of extension of the electrode 422 are electrically connected to each other by a wiring 432. The electrode 422 and the wiring 432 are preferably arranged so that the area of the intersections of the electrode 422 and the wiring 423 is as small as possible. Such shapes of the electrodes can reduce the area of a region where the electrodes are not provided and decrease luminance unevenness of light passing through the touch sensor 430 due to a difference in transmittance depending on existence of the electrodes.

Note that the shapes of the electrodes 421 and the electrode 422 are not limited to the above and can be a variety of shapes. For example, it is possible that a plurality of electrodes 421 are arranged so that the gaps therebetween are reduced as much as possible, and a plurality of electrodes 422 are provided over the electrodes 421 with an insulating layer therebetween to be spaced apart from each other and have regions not overlapping with the electrodes 421. In this case, it is preferable to provide, between two adjacent electrodes 422, a dummy electrode electrically insulated from these electrodes because the area of regions having different transmittances can be reduced.

The structure of the touch sensor 430 is described with reference to FIG. 15.

The touch sensor is provided over the second substrate 402. In the touch sensor, a sensor layer 440 is provided on one surface of the third substrate 403 with an insulating layer 424 placed therebetween and is bonded to the second substrate 402 with a bonding layer 434.

The sensor layer 440 is formed over the third substrate 403, and then attached to the second substrate 402 with the bonding layer 434. With such a method, a touch sensor is overlapped with a display panel, whereby a touch panel can be formed.

The insulating layer 424 can be formed using an oxide such as silicon oxide, for example. The light-transmitting electrodes 421 and 422 are provided in contact with the insulating layer 424. The electrodes 421 and 422 are formed in such a manner that a conductive film is formed by sputtering over the insulating layer 424 formed over the third substrate 403 and then unnecessary portions of the conductive film are removed by a known patterning technique such as photolithography. As a light-transmitting conductive material, a conductive oxide such as indium oxide, indium tin oxide, indium zinc oxide, zinc oxide, or zinc oxide to which gallium is added can be used.

A wiring 438 is electrically connected to the electrode 421 or the electrode 422. Part of the wiring 438 serves as an external connection electrode electrically connected to the FPC 415. The wiring 438 can be formed using a metal material such as aluminum, gold, platinum, silver, nickel, titanium, tungsten, chromium, molybdenum, iron, cobalt, copper, or palladium or an alloy material containing any of these metal materials.

The electrodes 422 are provided in the form of stripes extending in one direction. The electrodes 421 are arranged so that one electrode 422 is placed between a pair of electrodes 421. A wiring 432 that electrically connects the electrodes 421 is provided to cross the electrode 422. Here, one electrode 422 and a plurality of electrodes 421 electrically connected to each other by the wiring 432 do not necessarily cross orthogonally and may form an angle of less than 90°.

An insulating layer 433 is provided to cover the electrodes 421 and 422. Examples of a material for the insulating layer 433 are a resin such as an acrylic resin, an epoxy resin, and a resin having a siloxane bond and an inorganic insulating material such as silicon oxide, silicon oxynitride, and aluminum oxide. An opening reaching the electrode 421 is formed in the insulating layer 433, and the wiring 432, which is electrically connected to the electrode 421, is provided in the opening. The wiring 432 is preferably formed using a light-transmitting conductive material similar to that of the electrodes 421 and 422, in which case the aperture ratio of the touch panel can be increased. Although the wiring 432 may be formed using the same material as the electrodes 421 and 422, it is preferably formed using a material having higher conductivity than the material of the electrodes 421 and 422.

An insulating layer that covers the insulating layer 433 and the wiring 432 may be provided. The insulating layer can function as a protection layer.

An opening reaching the wiring 438 is formed in the insulating layer 433 (and the insulating layer serving as the protection layer), and the FPC 415 and the wiring 438 are electrically connected to each other with a connection layer 439 provided in the opening. For the connection layer 439, a known anisotropic conductive film (ACF), a known anisotropic conductive paste (ACP), or the like can be used.

The bonding layer 434 for bonding the sensor layer 440 and the second substrate 402 preferably has light-transmitting properties. For example, a thermosetting resin or an ultraviolet curable resin can be used, and specifically an acrylic resin, a urethane resin, an epoxy resin, a resin having a siloxane bond, or the like can be used.

<Display Portion>

The display portion 411 includes a pixel portion 413 including a plurality of pixels. As a display element that can be used in the pixel portion 413 of the display portion 411, any of a variety of display elements such as an organic EL element, a liquid crystal element, and a display element performing display with electrophoresis, electronic liquid powder, or the like can be used.

The case where a liquid crystal element is used as a display element is described below.

Liquid crystal 431 sandwiched between the first substrate 401 and the second substrate 402 is sealed by a sealant 436.

The sealant 436 is provided to surround a switching element layer 437 and a color filter layer 435.

For the sealant 436, a thermosetting resin or an ultraviolet curable resin can be used, and an organic resin such as an acrylic resin, a urethane resin, an epoxy resin, or a resin having a siloxane bond can be used. The sealant 436 may be formed using glass frit including low-melting-point glass. Alternatively, the sealant 436 may be formed with a combination of any of the above organic resins and glass frit. For example, the organic resin may be provided in contact with the liquid crystal 431 and glass frit may be provided on the outer surface of the organic resin, in which case water or the like can be prevented from being mixed into the liquid crystal from the outside.

The display portion 411 includes a source driver circuit 412$s$ and a gate driver circuit 412$g$ and is sealed between the first substrate 401 and the second substrate 402 together with the liquid crystal 431.

Although two source driver circuits 412$s$ are positioned on respective opposite sides of the pixel portion 413 in FIG. 14B, one source driver circuit 412$s$ may be positioned along one side of the pixel portion 413.

The switching element layer 437 is provided over the first substrate 401 (see FIG. 15). The switching element layer 437 includes at least a transistor, and may include an element such as a capacitor in addition to the transistor. Note that the switching element layer 437 may also include a circuit such as a driver circuit (a gate driver circuit or a source driver circuit), a wiring, an electrode, or the like.

The color filter layer 435 is provided on one surface of the second substrate 402. The color filter layer 435 includes a color filter that overlaps with the liquid crystal element. When the color filter layer 435 includes color filters of three colors of red (R), green (G), and blue (B), a full-color liquid crystal panel is obtained.

For example, the color filter layer 435 is formed using a photosensitive material including a pigment by a photolithography process. In the color filter layer 435, a black matrix may be provided between color filters of different colors. Further, an overcoat that covers the color filters and the black matrix may be provided.

Note that one of electrodes of the liquid crystal element may be formed on the color filter layer 435 depending on the structure of the liquid crystal element. Note that the electrode serves as part of the liquid crystal element to be formed later. An alignment film may be provided on the electrode.

A pair of polarizing plates 445 is provided to sandwich the liquid crystal 431. Specifically, the first substrate 401 and the third substrate 403 are provided with the respective polarizing plates 445.

The polarizing plate 445 is a known polarizing plate and is formed using a material capable of producing linearly polarized light from natural light or circularly polarized light. For example, a material whose optical anisotropy is obtained by disposing dichroic substances in one direction can be used. The polarizing plate 445 can be formed, for example, in such a manner that an iodine-based compound or the like is adsorbed to a film of polyvinyl alcohol or the like and the film is stretched in one direction. As the dichroic substance, a dye-based compound or the like as well as an iodine-based compound is used. A film-like, sheet-like, or plate-like material can be used for the polarizing plate 445.

This embodiment can be combined with any of the other embodiments in this specification as appropriate.

(Embodiment 8)

In this embodiment, electronic devices of one embodiment of the present invention will be described. Specifically, electronic devices each including a display device of one embodiment of the present invention will be described with reference to FIGS. 16A to 16C.

Examples of electronic devices to which the display device is applied are computers, cameras such as digital cameras and digital video cameras, digital photo frames, cellular phones (also referred to as mobile phones or portable telephone devices), portable information terminals, audio playback devices, and the like. Specific examples of these electronic devices are illustrated in FIGS. 16A to 16C.

Figure 16A:
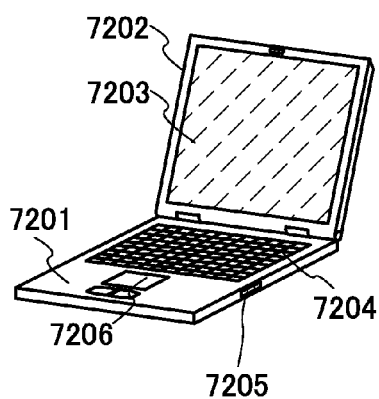
FIGS. 16A to 16C each illustrate an electronic device of an embodiment.

FIG. 16A illustrates a computer, which includes a main body 7201, a housing 7202, a display portion 7203, a keyboard 7204, an external connection port 7205, a pointing device 7206, and the like. Note that the computer displays the results of processing by an arithmetic device on the display portion 7203.

Figure 16B:
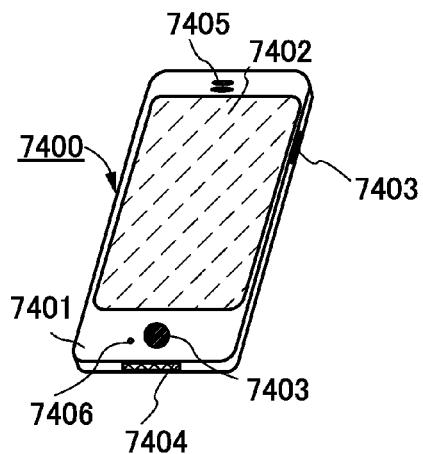
Figure 16C:
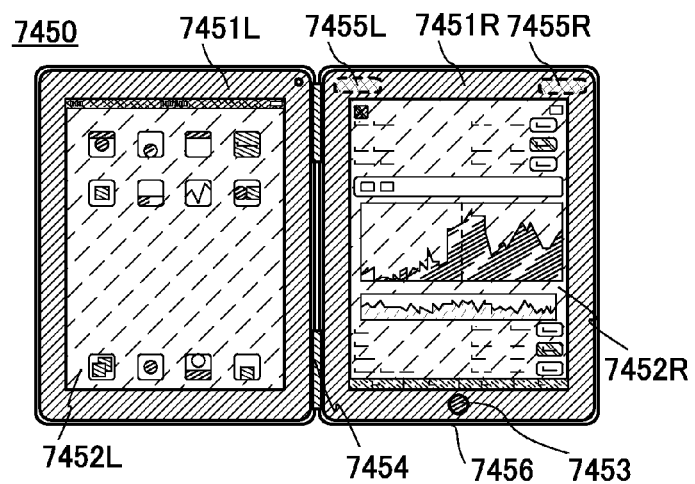

FIG. 16B illustrates an example of a mobile phone. The mobile phone 7400 is provided with a display portion 7402 incorporated in a housing 7401, operation buttons 7403, an external connection port 7404, a speaker 7405, a microphone 7406, and the like. Note that the mobile phone 7400 displays the results of processing by an arithmetic device on the display portion 7402.

When the display portion 7402 is touched with a finger or the like, data can be input into the mobile phone 7400 in FIG. 16B. Further, operations such as making a call and creating e-mail can be performed by touch on the display portion 7402 with a finger or the like.

There are mainly three screen modes of the display portion 7402. The first mode is a display mode mainly for displaying images. The second mode is an input mode mainly for inputting data such as text. The third mode is a display-and-input mode in which two modes of the display mode and the input mode are combined.

For example, in the case of making a call or composing an e-mail, a text input mode mainly for inputting text is selected for the display portion 7402 so that text displayed on a screen can be inputted. In this case, it is preferable to display a keyboard or number buttons on almost the entire screen of the display portion 7402.

When a detection device including a sensor for detecting inclination, such as a gyroscope or an acceleration sensor, is provided inside the mobile phone 7400, display on the screen of the display portion 7402 can be automatically changed by determining the orientation of the mobile phone 7400 (whether the mobile phone is placed horizontally or vertically for a landscape mode or a portrait mode).

The screen modes are switched by touching the display portion 7402 or operating the operation buttons 7403 of the housing 7401. Alternatively, the screen modes can be switched depending on kinds of images displayed on the display portion 7402. For example, when a signal of an image displayed on the display portion is a signal of moving image data, the screen mode is switched to the display mode. When the signal is a signal of text data, the screen mode is switched to the input mode.

Moreover, in the input mode, when input by touching the display portion 7402 is not performed within a specified period while a signal detected by an optical sensor in the display portion 7402 is detected, the screen mode may be controlled so as to be switched from the input mode to the display mode.

The display portion 7402 may function as an image sensor. For example, an image of a palm print, a fingerprint, or the like is taken by touch on the display portion 7402 with the palm or the finger, whereby personal authentication can be performed. Further, by providing a backlight or a sensing light source which emits a near-infrared light in the display portion, an image of a finger vein, a palm vein, or the like can be taken.

FIG. 16C illustrates an example of a folding computer. A folding computer 7450 includes a housing 7451L and a housing 7451R connected by hinges 7454. The folding computer 7450 further includes an operation button 7453, a left speaker 7455L, and a right speaker 7455R. In addition, a side surface of the folding computer 7450 is provided with an external connection port 7456, which is not illustrated. When the hinges 7454 are folded so that a display portion 7452L provided in the housing 7451L and a display portion 7452R provided in the housing 7451R face each other, the display portions can be protected by the housings.

Each of the display portions 7452L and 7452R is a component which can display images and to which information can be input by touch with a finger or the like. For example, an icon for an installed program is selected by touch with a finger so that the program can be started. Further, changing the distance between fingers touching two positions of a displayed image enables zooming in or out on the image. Drag of a finger touching one position of the displayed image enables drag and drop of the image. Selection of a displayed character or symbol on the displayed image of a keyboard by touch with a finger enables information input.

Further, the computer 7450 can also include a gyroscope, an acceleration sensor, a global positioning system (GPS) receiver, fingerprint sensor, or a video camera. For example, a detection device including a sensor which detects inclination, such as a gyroscope or an acceleration sensor, is provided to determine the orientation of the computer 7450 (whether the computer is placed horizontally or vertically for a landscape mode or a portrait mode) so that the orientation of the display screen can be automatically changed.

Furthermore, the computer 7450 can be connected to a network. The computer 7450 not only can display information on the Internet but also can be used as a terminal which controls another electronic device connected to the network from a distant place.

Note that this embodiment can be combined with any of the other embodiments in this specification as appropriate.

This application is based on Japanese Patent Application serial no. 2012-262851 filed with Japan Patent Office on Nov. 30, 2012, the entire contents of which are hereby incorporated by reference.

What is claimed is:

1. A display device comprising:
    a display portion comprising a driver circuit and a pixel including a display element and a transistor; and
    a control portion configured to generate a secondary image signal from a primary image signal and configured to supply the secondary image signal to the display portion,
    wherein the control portion is configured to correct the primary image signal so that feedthrough caused by a parasitic capacitance of the transistor is compensated,
    wherein an amplitude of the secondary image signal corresponds to a difference between a potential of the corrected primary image signal and a reference potential,
    wherein the driver circuit is configured to output a driving signal to the pixel, and
    wherein the control portion is configured to generate the secondary image signal by adding feedthrough $\Delta V_1$, of a signal with an amplitude of VS1 calculated from a function represented by a formula (1) to a potential of the primary image signal when a polarity of the secondary image signal is positive and by adding feedthrough $\Delta V_2$ of a signal with an amplitude of VS2 calculated from a function represented by a formula (2) to the potential of the primary image signal when the polarity of the secondary image signal is negative, $$\Delta V_1 = f(VgH - Vsc - VS1 - Vth) \quad (1)$$

$$\Delta V_2 = f(VgH - Vsc + VS2 - Vth) \quad (2)$$

where VgH represents a high potential of the driving signal, Vsc represents the reference potential, and Vth represents a threshold voltage of the transistor.

2. The display device according to claim 1,
    wherein the display element is a liquid crystal display element.

3. The display device according to claim 1,
    wherein the control portion is configured to determine the polarity of the secondary image signal with respect to the reference potential.

4. The display device according to claim 1,
    wherein the control portion is configured to correct the primary image signal on the basis of an amount of the feedthrough which is estimated by calculation or obtained from empirical data on the basis of a grayscale information included in the primary image signal.

5. The display device according to claim 1, wherein the transistor includes an oxide semiconductor layer.

6. The display device according to claim 5,
    wherein an off-state current of the transistor is less than or equal to $1 \times 10^{-24}$ A at room temperature.

7. An information processing device comprising an arithmetic device, an input unit and the display device according to claim 1.

8. A display device comprising:
    a display portion comprising a first driver circuit, a first signal line, a second driver circuit, a second signal line and a pixel including a display element and a transistor; and
    a control portion comprising a feedthrough correction circuit and a polarity determination circuit,
    wherein the display element includes a first electrode and a second electrode,
    wherein one of a source and a drain of the transistor is electrically connected to the first electrode,
    wherein the first signal line is electrically connected to the first driver circuit and the other of the source and the drain of the transistor,
    wherein the second signal line is electrically connected to the second driver circuit and a gate of the transistor,
    wherein the feedthrough correction circuit is configured to correct a primary image signal so that feedthrough caused by a parasitic capacitance of the transistor is compensated and supply a secondary image signal to the first driver circuit,
    wherein an amplitude of the secondary image signal corresponds to a difference between a potential of the corrected primary image signal and a reference potential,
    wherein the polarity determination circuit is configured to determine a polarity of the secondary image signal with respect to the reference potential,
    wherein the second driver circuit is configured to output a driving signal to the second signal line, and
    wherein the feedthrough correction circuit is configured to generate the secondary image signal by adding feedthrough $\Delta V_1$ of a signal with an amplitude of VS1 calculated from a function represented by a formula (1) to a potential of the primary image signal when the polarity of the secondary image signal determined by the polarity determination circuit is positive and by adding feedthrough $\Delta V_2$, of a signal with an amplitude of VS2 calculated from a function represented by a formula (2) to the potential of the primary image signal when the polarity of the secondary image signal determined by the polarity determination circuit is negative, $$\Delta V_1 = f(VgH - Vsc - VS1 - Vth) \quad (1)$$

$$\Delta V_2 = f(VgH - Vsc + VS2 - Vth) \quad (2)$$

where VgH represents a high potential of the driving signal, Vsc represents the reference potential, and Vth represents a threshold voltage of the transistor.

9. The display device according to claim 8, wherein the display element is a liquid crystal display element.

10. The display device according to claim 8, wherein the control portion is configured to supply a control signal to the second driver circuit, wherein the control signal includes a mode switching signal for switching the display device between a first mode and a second mode, wherein the second driver circuit is configured to output a signal for selecting the pixel at a rate of more than or equal to 60 Hz and less than 960 Hz in the first mode, and wherein the second driver circuit is configured to output the signal for selecting the pixel at a rate of more than or equal to 0.28 mHz and less than 1 Hz in the second mode.

11. The display device according to claim 8, wherein the transistor includes an oxide semiconductor layer.

12. The display device according to claim 11, wherein an off-state current of the transistor is less than or equal to $1 \times 10^{-24}$ A at room temperature.

13. An information processing device comprising an arithmetic device, an input unit and the display device according to claim 8.

14. A method for driving a display device comprising a control portion and a display portion comprising a first driver circuit, a first signal line, a second driver circuit, a second signal line and a pixel including a display element and a transistor, the method comprising the steps of:
inputting a primary image signal to the control portion;
generating a secondary image signal from the primary image signal; and
supplying the secondary image signal to the first driver circuit,
wherein a first electrode of the display element is electrically connected to the first driver circuit through the transistor and the first signal line,
wherein a second electrode of the display element is supplied with a reference potential,
wherein the control portion corrects the primary image signal so that feedthrough caused by a parasitic capacitance of the transistor is compensated,
wherein an amplitude of the secondary image signal corresponds to a difference between a potential of the corrected primary image signal and the reference potential, and
wherein a polarity of the secondary image signal with respect to the reference potential is inverted every frame,
wherein the control portion is configured to generate the secondary image signal by adding feedthrough $\Delta V_1$ of a signal with an amplitude of VS1 calculated from a function represented by a formula (1) to the potential of the primary image signal when the polarity of the secondary image signal with respect to the reference potential is positive and by adding feedthrough $\Delta V_2$ of a signal with an amplitude of VS2 calculated from a function represented by a formula (2) to the potential of the primary image signal when the polarity of the secondary image signal with respect to the reference potential is negative, $$\Delta V_1 = f(VgH - Vsc - VS1 - Vth) \quad (1)$$

$$\Delta V_2 = f(VgH - Vsc + VS2 - Vth) \quad (2)$$

where VgH represents a high potential of a driving signal applied to a gate of the Transistor, Vsc represents the reference potential, and Vth represents a threshold voltage of the transistor.

15. The method for driving a display device according to claim 14, further comprising the step of supplying a control signal to the second driver circuit by the control portion,
wherein the control signal includes a mode switching signal switching the display device between a first mode and a second mode,
wherein the second driver circuit outputs a signal for selecting the pixel at a rate of more than or equal to 60 Hz and less than 960 Hz in the first mode, and
wherein the second driver circuit outputs the signal for selecting the pixel at a rate of more than or equal to 0.28 mHz and less than 1 Hz in the second mode.

16. The method for driving a display device according to claim 14,
wherein in a period during which a still image is displayed in the display portion, the control portion corrects the primary image signal so that the amplitude of the secondary image signal becomes smaller when the polarity is negative than when the polarity is positive.

17. The method for driving a display device according to claim 14, wherein the transistor includes an oxide semiconductor layer.

18. The display device according to claim 17, wherein an off-state current of the transistor is less than or equal to $1 \times 10^{-24}$ A at room temperature.

* * * * *